US012685146B2

(12) United States Patent
Takahashi et al.

(10) Patent No.: US 12,685,146 B2
(45) Date of Patent: Jul. 14, 2026

(54) SEMICONDUCTOR DEVICE, AMPLIFYING DEVICE, AND METHOD OF MANUFACTURING SEMICONDUCTOR DEVICE

(71) Applicant: FUJITSU LIMITED, Kawasaki (JP)

(72) Inventors: Tsuyoshi Takahashi, Ebina (JP); Kenichi Kawaguchi, Ebina (JP)

(73) Assignee: Fujitsu Limited, Kawasaki (JP)

( * ) Notice: Subject to any disclaimer, the term of this patent is extended or adjusted under 35 U.S.C. 154(b) by 534 days.

(21) Appl. No.: 18/333,584

(22) Filed: Jun. 13, 2023

(65) Prior Publication Data

US 2023/0326832 A1 Oct. 12, 2023

Related U.S. Application Data

(63) Continuation of application No. PCT/JP2021/000403, filed on Jan. 7, 2021.

(51) Int. Cl.
*H03F 3/191* (2006.01)
*H03F 1/56* (2006.01)
(Continued)

(52) U.S. Cl.
CPC ............ *H10W 20/484* (2026.01); *H03F 1/56* (2013.01); *H03F 3/04* (2013.01); *H10D 30/015* (2025.01);
(Continued)

(58) Field of Classification Search
CPC ............. H01L 23/4824; H01L 23/4825; H01L 23/4827; H01L 23/66; H01L 2223/6655;
(Continued)

(56) References Cited

U.S. PATENT DOCUMENTS 6,504,292 B1 1/2003 Choi et al.
9,673,277 B2 * 6/2017 Brand .................... H10D 62/85
(Continued)

FOREIGN PATENT DOCUMENTS

JP H02-117145 A 5/1990
JP H06-053714 A 2/1994
(Continued)

OTHER PUBLICATIONS

Japanese Office Action mailed on Aug. 13, 2024 for corresponding Japanese Patent Application No. 2022-573867, with English Translation, 9 pages. Please note JP-2-117145-A, JP-2018-56377-A, JP-2012-521655-A and JP-2018-101700-A cited herewith, were previously cited in an IDS filed on Jun. 13, 2023.
(Continued)

*Primary Examiner* — Khanh V Nguyen
(74) *Attorney, Agent, or Firm* — Fujitsu Intellectual Property Center

(57) ABSTRACT

A semiconductor device includes a substrate; a gate electrode, a source electrode, and a drain electrode, the gate electrode, the source electrode and the drain electrode being formed on the substrate; a plurality of nonconductive nanowires formed two-dimensionally on an upper surface of the substrate so as to extend perpendicularly to the upper surface of the substrate; an electrode pad formed at upper ends of the plurality of nanowires so as to have a gap between the electrode pad and the substrate, the electrode pad being supported by the plurality of nanowires; and an extraction electrode connecting the electrode pad and the gate electrode.

9 Claims, 23 Drawing Sheets

(51) Int. Cl.

| | |
|---|---|
| *H03F 3/04* | (2006.01) |
| *H10D 30/01* | (2025.01) |
| *H10D 30/47* | (2025.01) |
| *H10W 20/40* | (2026.01) |
| *H10W 44/20* | (2026.01) |

(52) U.S. Cl.
CPC .......... *H10D 30/475* (2025.01); *H10W 20/40* (2026.01); *H10W 44/20* (2026.01); *H03F 2200/222* (2013.01); *H03F 2200/387* (2013.01); *H10W 44/234* (2026.01)

(58) Field of Classification Search
CPC ........... H01L 2224/02145; H01L 24/03; H01L 24/05; H01L 2224/02125; H01L 2224/03013; H01L 2924/3011; H03F 1/56; H03F 3/04; H03F 2200/222; H03F 2200/387; H03F 2200/294; H03F 3/195; H10D 30/015; H10D 30/475; H10D 30/4755; H10D 62/117; H10D 62/357; H10D 62/824; H10D 64/411
USPC .................................................. 330/302, 307
See application file for complete search history.

(56) References Cited

U.S. PATENT DOCUMENTS

| | | | | |
|---|---|---|---|---|
| 10,833,048 | B2 * | 11/2020 | Hung ...................... | H01L 24/92 |
| 11,670,637 | B2 * | 6/2023 | Radosavljevic ... | H10D 84/0179 |
| | | | | 257/20 |
| 2012/0012968 | A1 | 1/2012 | Konsek | |
| 2013/0043945 | A1 | 2/2013 | Mcdermott et al. | |

FOREIGN PATENT DOCUMENTS

| | | |
|---|---|---|
| JP | 2001-096499 A | 4/2001 |
| JP | 2012-521655 A | 9/2012 |
| JP | 2018-056377 A | 4/2018 |
| JP | 2018-101700 A | 6/2018 |
| JP | 2019-067974 A | 4/2019 |

OTHER PUBLICATIONS

International Search Report and Written Opinion of the International Searching Authority (Form PCT/ISA/210 and 237), mailed in connection with PCT/JP2021/000403 and mailed Apr. 6, 2021 (Total 10 pages).

* cited by examiner

SEMICONDUCTOR DEVICE, AMPLIFYING DEVICE, AND METHOD OF MANUFACTURING SEMICONDUCTOR DEVICE

CROSS-REFERENCE TO RELATED APPLICATIONS

This application is a continuation application of International Application PCT/JP2021/000403 filed on Jan. 7, 2021 and designated the U.S., the entire contents of which are incorporated herein by reference.

FIELD

The disclosures discussed herein relate to a semiconductor device, an amplifying device, and a method of manufacturing the semiconductor device.

BACKGROUND

In a quantum computer, microwave output signals from a qubit are extremely weak, and a low-noise amplifier is used to amplify the microwave output signals with low noise. Noise characteristics of a transistor used in the amplifier are highly dependent on gate capacitance, and it is preferable to reduce the gate capacitance by shortening the gate length. However, even if the gate length is shortened to reduce the intrinsic capacitance, a semiconductor layer with a high dielectric constant is present under the electrode pad, which is connected to the gate electrode for signal supply from external wiring, and as a result, relatively large parasitic capacitance of the electrode pad remains as capacitance of the gate electrode. Since the area of the electrode pad is several μm squared, much larger than the gate length of several tens of nanometers, the parasitic capacitance due to the electrode pad is a major impediment to noise reduction in the amplifier. The electrode pad provided for electrical connection requires a minimum of certain size area, so there appears to be a limit to reducing parasitic capacitance by reducing the size of the electrode pad.

RELATED ART DOCUMENTS

Patent Documents

[Patent document 1] Japanese Patent Laid-Open No. 2001-96499
[Patent document 2] Japanese Patent Laid-Open No. 6-53714
[Patent document 3] U.S. Patent Application Publication No. 2013-0043945

SUMMARY

According to an aspect of an embodiment, a semiconductor device includes a substrate; a gate electrode, a source electrode, and a drain electrode, the gate electrode, the source electrode and the drain electrode being formed on the substrate; a plurality of nonconductive nanowires formed two-dimensionally on an upper surface of the substrate so as to extend perpendicularly to the upper surface of the substrate; an electrode pad formed at upper ends of the plurality of nanowires so as to have a gap between the electrode pad and the substrate, the electrode pad being supported by the plurality of nanowires; and an extraction electrode connecting the electrode pad and the gate electrode.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

DESCRIPTION OF EMBODIMENTS

In view of the above, it may be desirable to configure a semiconductor device with reduced parasitic capacitance of an electrode pad connected to a gate electrode.

In the following, embodiments of the invention will be described with reference to the accompanying drawings.

Figure 1:
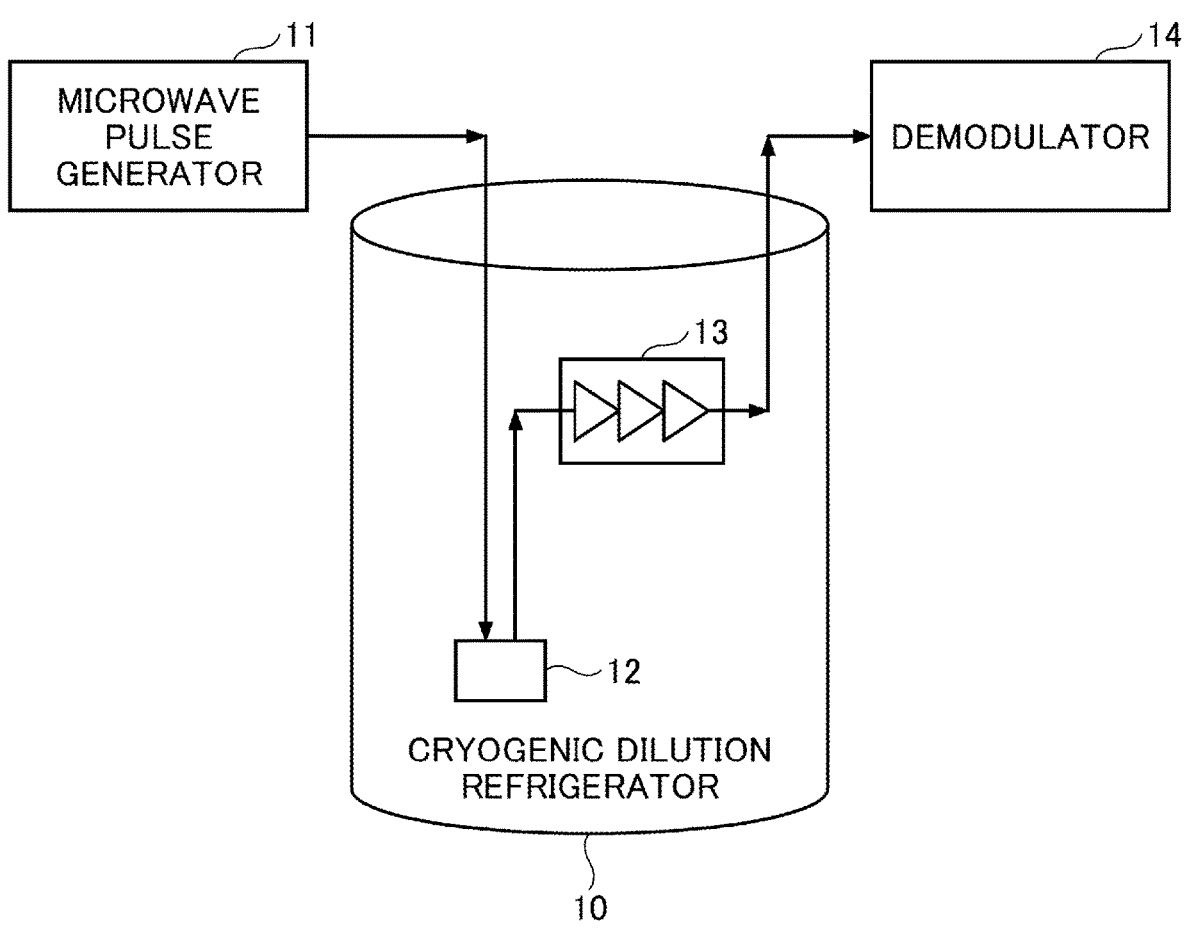
FIG. 1 is a diagram illustrating an example of a configuration of a quantum computer.

FIG. 1 is a diagram illustrating an example of a configuration of a quantum computer. The quantum computer illustrated in FIG. 1 includes a cryogenic dilution refrigerator 10, a microwave pulse generator 11, a qubit chip 12, a low-noise amplifier 13, and a demodulator 14.

The cryogenic dilution refrigerator 10 uses helium-4 and helium-3, which are isotopes of helium, to cool, for example, the inside of a cylindrical casing to cryogenic temperatures on an order of several mK. The microwave pulse generator 11 placed in an external room-temperature environment generates microwave pulses and inputs the generated microwave pulses to the qubit chip 12, which is set to cryogenic temperatures of approximately 10 mK. The qubit chip 12 performs quantum operations based on the qubits according to the input microwave pulses and outputs microwaves according to the state of the qubits after the operations. The low-noise amplifier 13 brought to a cryogenic state of approximately 4 K amplifies the output microwaves with low noise, and supplies the amplified microwaves to the demodulator 14 placed in the external room-temperature environment. The demodulator 14 demodulates the amplified microwaves.

Figure 2:
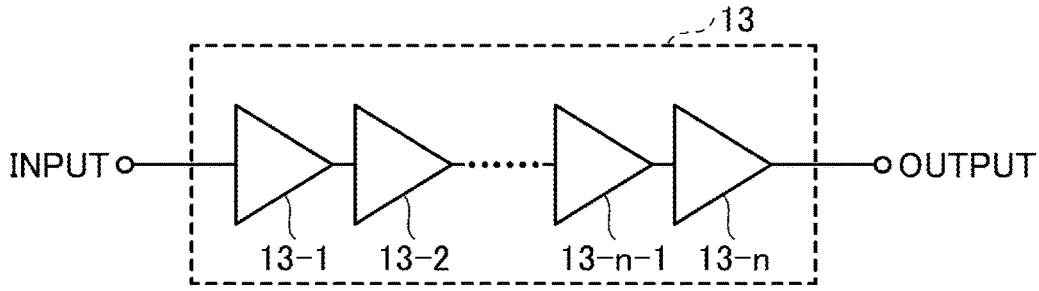
FIG. 2 is a diagram illustrating an example of a configuration of a low-noise amplifier.

FIG. 2 is a diagram illustrating an example of a configuration of the low-noise amplifier 13. The low-noise amplifier 13 includes a number of cascaded amplifying devices 13-1 to 13-$n$. The output signal from the qubit chip 12 illustrated in FIG. 1 is input to a first-stage amplifying device 13-1, and the output signal from the i-stage (i=1 to n−1) amplifying device 13-1 is input to an (i+1)-stage amplifying device 13-1. The output signal of an n-stage amplifying device 13-1 is supplied to the demodulator 14 illustrated in FIG. 1 as the output of the low-noise amplifier 13.

Figure 3:
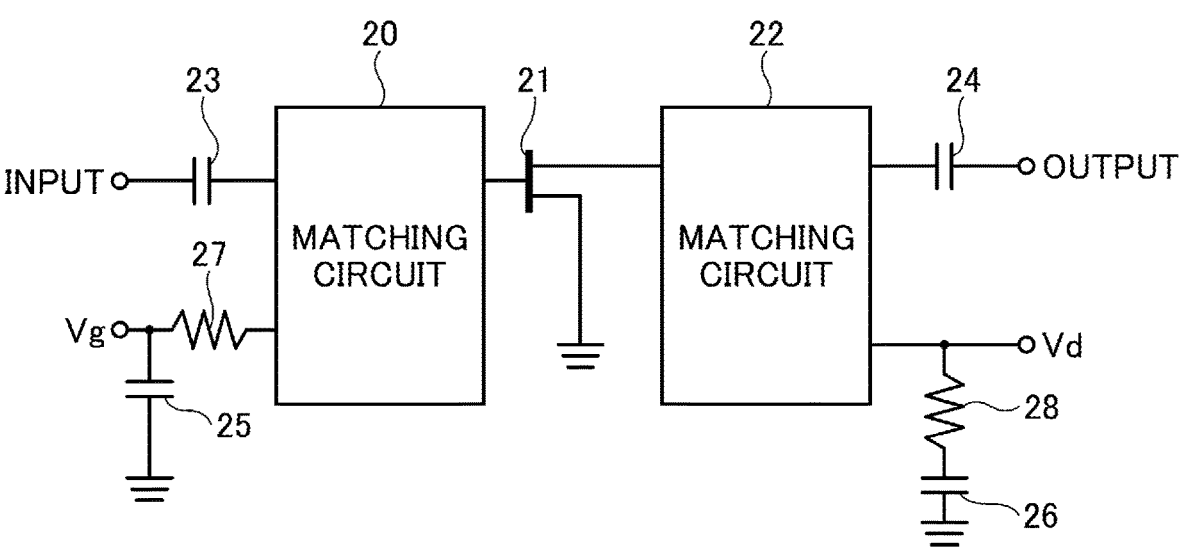
FIG. 3 is a diagram illustrating an example of a configuration of an amplifying device.

FIG. 3 is a diagram illustrating an example of a configuration of one amplifying device. The amplifying device illustrated in FIG. 3 may be used as each of the amplifying devices 13-1 to 13-$n$.

The amplifying device illustrated in FIG. 3 includes a first matching circuit 20, a transistor 21, a second matching circuit 22, capacitive elements 23 to 26, and resistive elements 27 and 28. The input signal to the amplifying device is applied to a gate electrode of the transistor 21 via the capacitive element 23 and the first matching circuit 20. The first matching circuit 20 performs impedance matching between the input side and the transistor 21 side. The transistor 21 amplifies the input signal applied to the gate electrode. The amplified signal is output to the outside via the second matching circuit 22 and the capacitive element 24. The second matching circuit 22 performs impedance matching between the transistor 21 side and the output side.

To apply an input signal to the gate electrode of the transistor 21, a signal line supplying the input signal is connected to an electrode pad connected to the gate electrode. To achieve amplification operation with low noise by the transistor 21, the parasitic capacitance between the electrode pad and the source or drain electrode via the substrate needs to be reduced.

Figure 4:
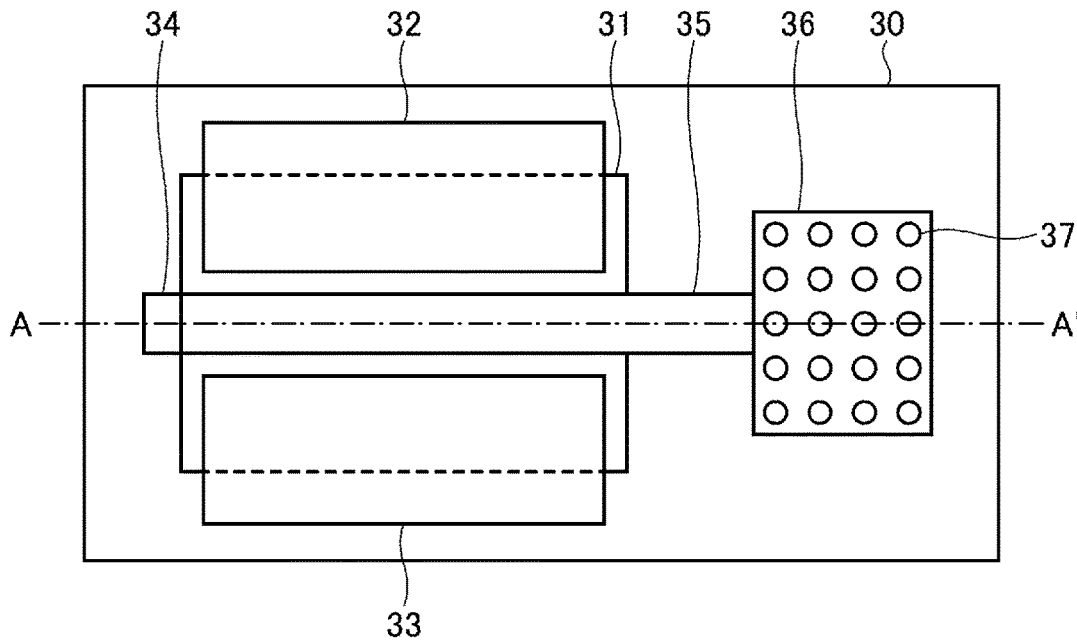
FIG. 4 is a top view illustrating an example of a configuration of a semiconductor device in which parasitic capacitance of an electrode pad is reduced.
Figure 5:
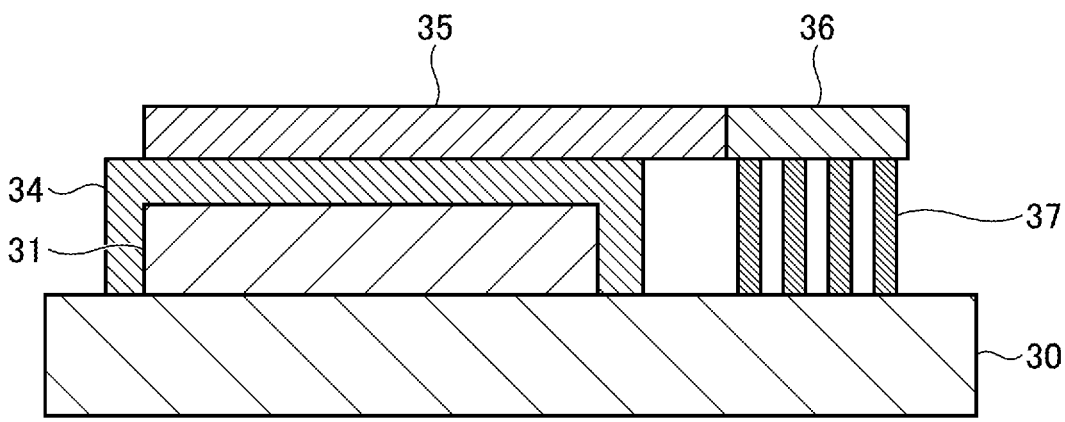
FIG. 5 is a cross-sectional view illustrating a cross section taken along a line A-A' of the semiconductor device illustrated in FIG. 4.

FIG. 4 is a top view illustrating an example of a configuration of a semiconductor device in which parasitic capacitance of the electrode pad is reduced. FIG. 5 is a cross-sectional view illustrating a cross section taken along a line A-A' of the semiconductor device illustrated in FIG. 4.

The semiconductor device illustrated in FIGS. 4 and 5 includes a dielectric substrate 30, an active region 31, a source electrode 32, a drain electrode 33, a gate electrode 34, an extraction electrode 35, an electrode pad 36, and multiple nonconductive nanowires 37. The semiconductor device illustrated in FIGS. 4 and 5 is a compound semiconductor in which the active region 31 is formed on the substrate 30. The substrate 30 functions as an element isolation region.

The gate electrode 34, the source electrode 32, and the drain electrode 33 are arranged on the substrate 30 (more specifically, on an upper surface of the active region 31). The multiple nonconductive nanowires 37 are arranged two-dimensionally on the upper surface of the substrate 30 so as to extend perpendicularly to the upper surface of the substrate 30. The electrode pad 36 is positioned at upper ends of the multiple nanowires 37 so as to have a gap between the electrode pad and the substrate 30, and is supported by the multiple nanowires 37. The extraction electrode 35 electrically connects the electrode pad 36 to the gate electrode 34.

Examples of preferred materials for the multiple nanowires 37 include AlGaAs, InAlAs, AlAs, InP, InAlP, GaP, AlGaP, InAsP, GaAsSP, GaSb, AlSb, AlGaSb, GaAsSb, and AlAsSb. Further examples of this material include GaN, AlN, AlGaN, InAlN, Si, Ge, SiGe, and C (diamond).

With the above configuration in which the electrode pad 36 is supported in an unfilled space by the multiple nanowires 37 an empty space is provided between the electrode pad 36 and the dielectric substrate 30. Therefore, parasitic capacitance generated by the substrate 30, a semiconductor with high dielectric constant, under the electrode pad 36 can be greatly reduced. Therefore, noise in the signal input to the transistor can be reduced.

In the semiconductor device illustrated in FIG. 5, the gate electrode 34, the source electrode 32, and the drain electrode 33 are formed on the upper surface of the active region 31, and the active region 31 includes a channel layer and an electron supply layer, as described later. With the transistor having a HEMT (High Electron Mobility Transistor) structure, noise in the transistor can be further reduced.

Figure 6:
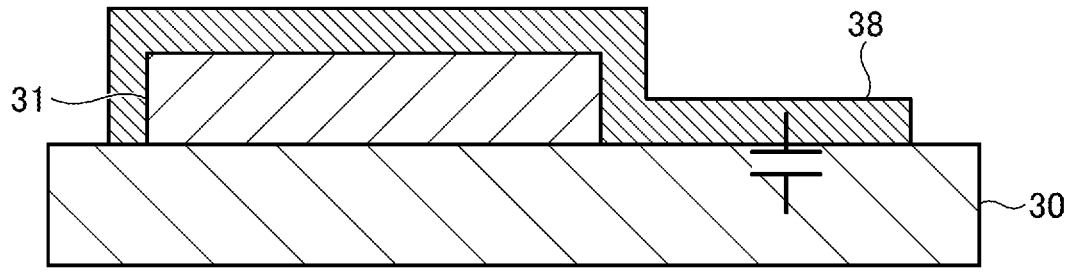
FIG. 6 is a cross-sectional view illustrating a configuration of a gate electrode in a typical compound semiconductor.

FIG. 6 is a cross-sectional view illustrating a configuration of a gate electrode in a typical compound semiconductor. Unlike the configuration illustrated in FIG. 5, in the typical compound semiconductor, an electrode pad 38 integrated with a gate electrode is formed so as to directly contact an upper surface of a substrate 30. Therefore, relatively large capacitance is generated between the electrode pad 38 and the source electrode (not illustrated) or the drain electrode (not illustrated) via the dielectric substrate 30.

In contrast, in the configuration illustrated in FIG. 5, the capacitance between the electrode pad 36 and the source electrode 32 or the drain electrode 33 is reduced because a gap is provided between the electrode pad 36 and the substrate 30. In addition, the electrode pad 36 is supported by the multiple nanowires 37, so that the necessary and sufficient mechanical strength can be maintained. Accordingly, bonding wires and bumps can be easily formed on the electrode pad 36. Also, in the configuration illustrated in FIG. 5, the extraction electrode 35 is arranged so as to overlap the upper surface of the gate electrode 34, which is equivalent to an increase in a cross-sectional area of the gate electrode when both are considered together. Since this configuration can reduce the gate resistance, the effect of further noise reduction can be obtained.

Figure 7:
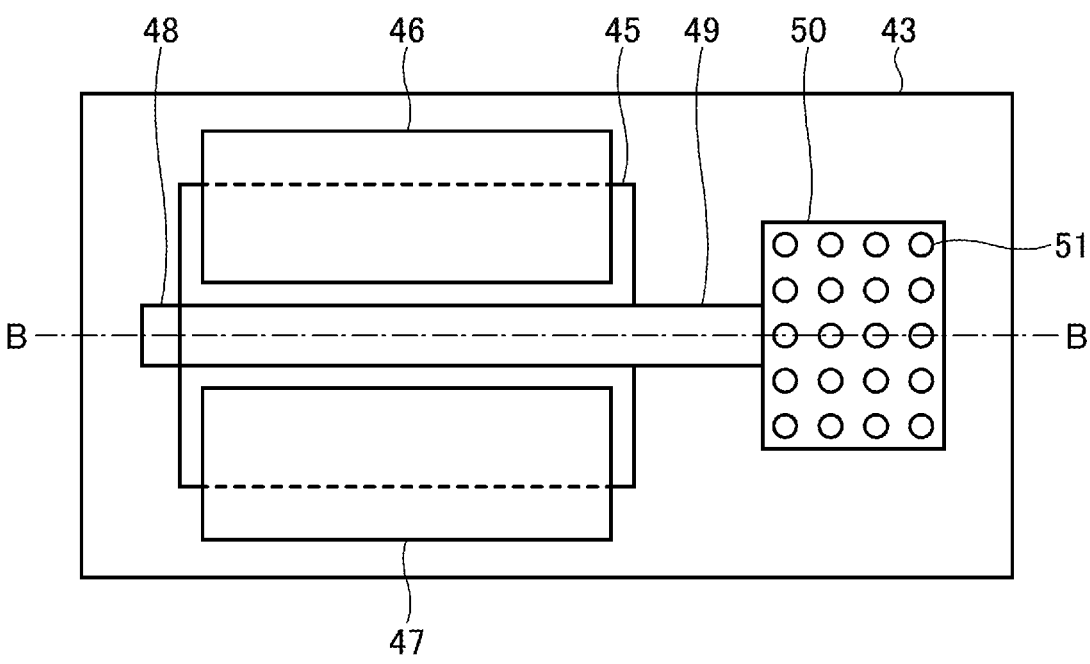
FIG. 7 is a top view illustrating an 2C example of a configuration of a semiconductor device according to a first embodiment.
Figure 8:
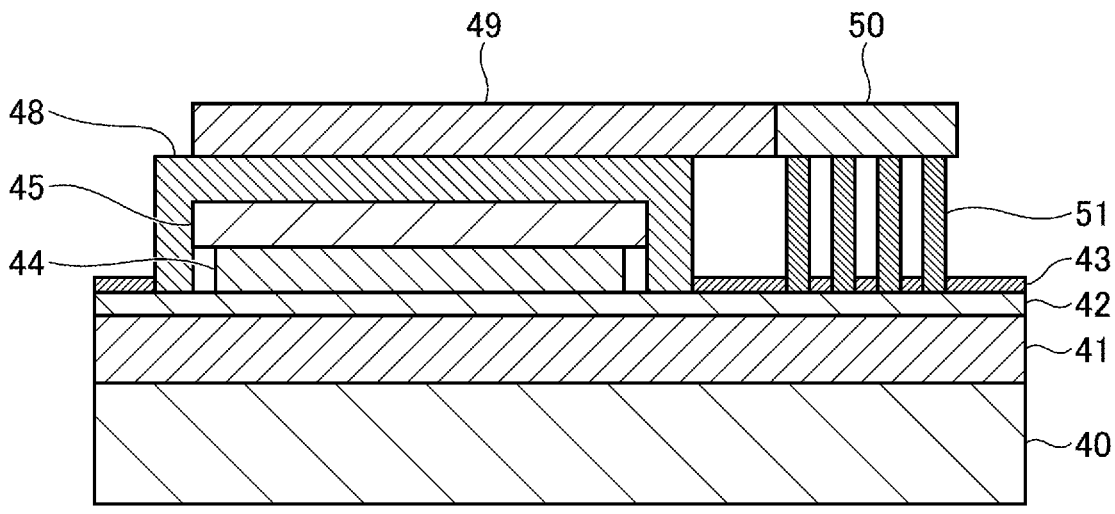
FIG. 8 is a cross-sectional view illustrating a cross section taken along a line B-B' of the semiconductor device illustrated in FIG. 7.

FIG. 7 is a top view illustrating an example of a configuration of the semiconductor device according to the first embodiment. FIG. 8 is a cross-sectional view illustrating a cross section taken along a line B-B' of the semiconductor device illustrated in FIG. 7.

The semiconductor device illustrated in FIGS. 7 and 8 includes a semi-insulating InP substrate 40, an i-InAlAs buffer layer 41, an i-GaAs layer 42, a $SiO_2$ layer 43, an i-InGaAs channel layer 44, and an n-InAlAs supply layer 45. The semiconductor device further includes a source electrode 46, a drain electrode 47, a gate electrode 48, an extraction electrode 49, an electrode pad 50, and multiple nonconductive nanowires 51. The source electrode 46, the drain electrode 47, and the gate electrode 48 may all be Ti/Pt/Au. Although not illustrated, n-InGaAs may be provided directly beneath the source electrode 46 and the drain electrode 47 for a non-alloyed ohmic connection.

The semiconductor device according to the first embodiment illustrated in FIGS. 7 and 8 has basically the same configuration as the semiconductor device illustrated in FIG. 4. That is, the gate electrode 48, the source electrode 46, and the drain electrode 47 are arranged on (above) the substrate (InP substrate 40, i-InAlAs buffer layer 41, i-GaAs layer 42, and $SiO_2$ layer 43). The multiple nonconductive nanowires 51 are arranged two-dimensionally on the upper surface of the substrate so as to extend perpendicularly to the upper surface of the substrate. The electrode pad 50 is arranged at upper ends of the multiple nanowires 51 so as to have a gap between the electrode pad and the substrate, and is supported by the multiple nanowires 51. The extraction electrode 49 electrically connects the electrode pad 50 to the gate electrode 48.

In the semiconductor device according to the first embodiment illustrated in FIGS. 7 and 8, the i-InGaAs channel layer 44 and the n-InAlAs supply layer 45 correspond to the active region. The gate electrode 48, the source electrode 46, and the drain electrode 47 are formed on the upper surface of the active region. The n-InAlAs supply layer 45 functions as an electron supply layer that supplies electrons, and the i-InGaAs channel layer 44 functions as an electron transport layer that transports electrons from the source electrode side to the drain electrode side. Thus, the semiconductor device according to the first embodiment has a HEMT structure.

The multiple nanowires 51 are formed by crystal growth of non-doped GaAs (i-GaAs). The nanowires 51 have substantially circular cross sections in a horizontal direction (more specifically, a prismatic shape according to a crystal structure), and the diameter is on the order of nanometers. The diameter of the nanowires 51 is, for example, preferably 50 nm or more and 200 nm or less, and more preferably 90 nm or more and 110 nm or less. The nanowires being thinner than 50 nm may have strength problems, and the nanowires being thicker than 200 nm may lose the capacitance reduction effect. Also, when the diameter is smaller than 50 nm or larger than 200 nm, it becomes difficult to grow multiple nanowires 51 into desired shapes.

The spacing between the multiple nanowires 51 is, for example, preferably 250 nm or more and 1000 nm or less, and more preferably approximately 500 nm. When the spacing is narrower than 250 nm and the number of nanowires increases, the effect of capacitance reduction becomes small, and when the spacing is wider than 1000 nm and the number of nanowires decreases, the strength problem occurs. When the spacing is narrower than 250 nm or wider than 1000 nm, the crystal growth of multiple nanowires 51 into the desired shape becomes difficult.

In the semiconductor device according to the first embodiment, the substrate includes a first layer (i-GaAs layer 42) made of the same material as the material (i-GaAs) used for the multiple nanowires 51, and lower ends of the multiple nanowires 51 are in contact with the first layer (i-GaAs layer 42). By providing the i-GaAs layer 42, the i-GaAs layer 42 is made to function as a basis for crystal growth, enabling crystal growth of the multiple nanowires 51. By using the i-GaAs layer 42 having an upper surface being a (111) B-plane, i.e., using the i-GaAs layer having a (111) B-plane orientation, the multiple nanowires 51 can grow in a vertical direction. The (111) B-plane orientation of the i-GaAs layer 42 is implemented by using the InP substrate 40 with the (111) B-plane orientation.

In the semiconductor device illustrated in FIGS. 7 and 8, the i-InGaAs channel layer 44 and the n-InAlAs supply layer 45 are separated by mesa etching. The i-InGaAs channel layer 44 is shorter than the n-InAlAs supply layer 45 in a lateral direction in the figures. This configuration is to prevent the gate electrode 48 formed on the sides as well as on the upper surface of the active region from being electrically short-circuited with the i-InGaAs channel layer 44.

In the following, a method of manufacturing the semiconductor device according to the first embodiment illustrated in FIGS. 7 and 8 is described in detail.

Figure 9:
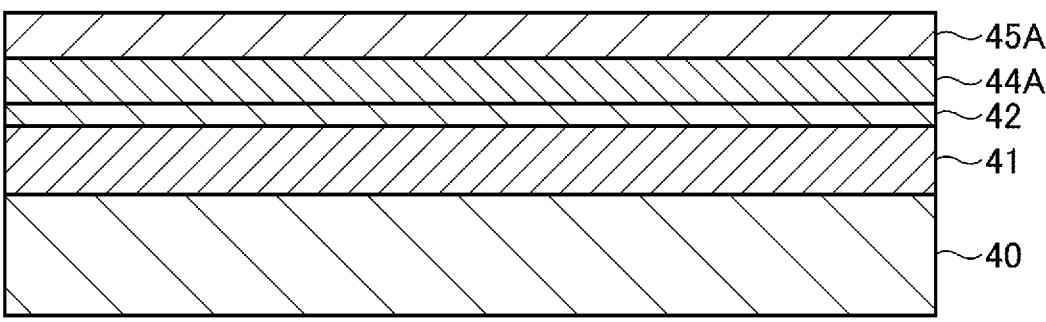
FIG. 9 is a diagram illustrating a method of manufacturing the semiconductor device according to the first embodiment.

As illustrated in FIG. 9, an i-InAlAs buffer layer 41, an i-GaAs layer 42, an i-InGaAs layer 44A, and an n-InAlAs layer 45A are sequentially grown on an InP substrate 40 having a (111) B-plane orientation. The thickness of each layer is, for example, 200 nm for the i-InAlAs buffer layer 41, 5 nm for the i-GaAs layer 42, 10 nm for the i-InGaAs layer 44A, and 9 nm for the n-InAlAs layer 45A. The doping concentration of the n-InAlAs layer 45A may, for example, be 1e19 cm$^{-1}$.

Figure 10:
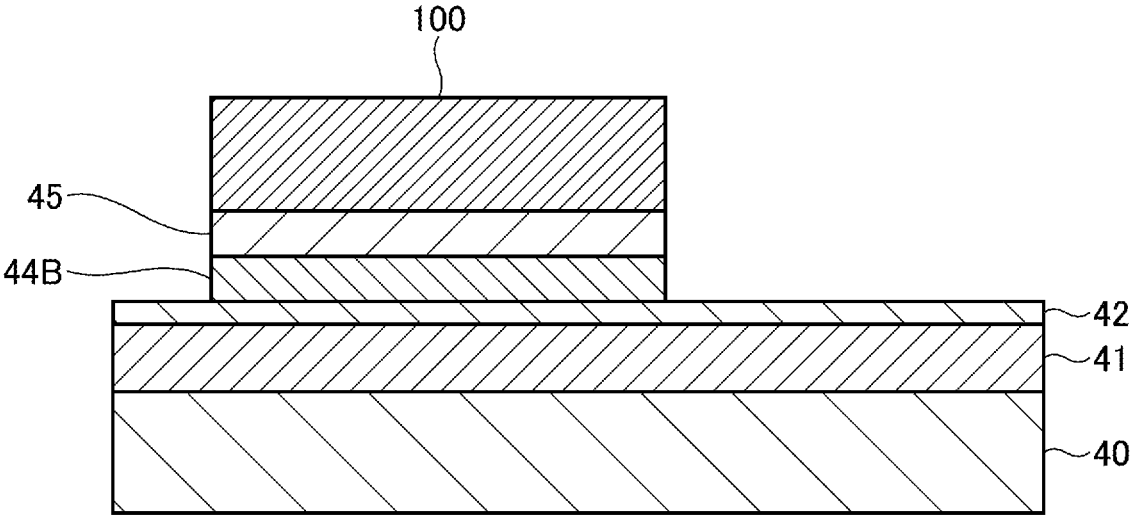
FIG. 10 is a diagram illustrating the method of manufacturing the semiconductor device according to the first embodiment.

In FIG. 10, a resist 100 covering an active region is formed by photolithography, and the InGaAs layer 44A and the n-InAlAs layer 45A are wet etched to form a mesa-structured element separation. That is, the i-InGaAs layer 44A and the n-InAlAs layer 45A are scraped by wet etching to form an InGaAs layer 44B and an n-InAlAs supply layer 45.

Figure 11:
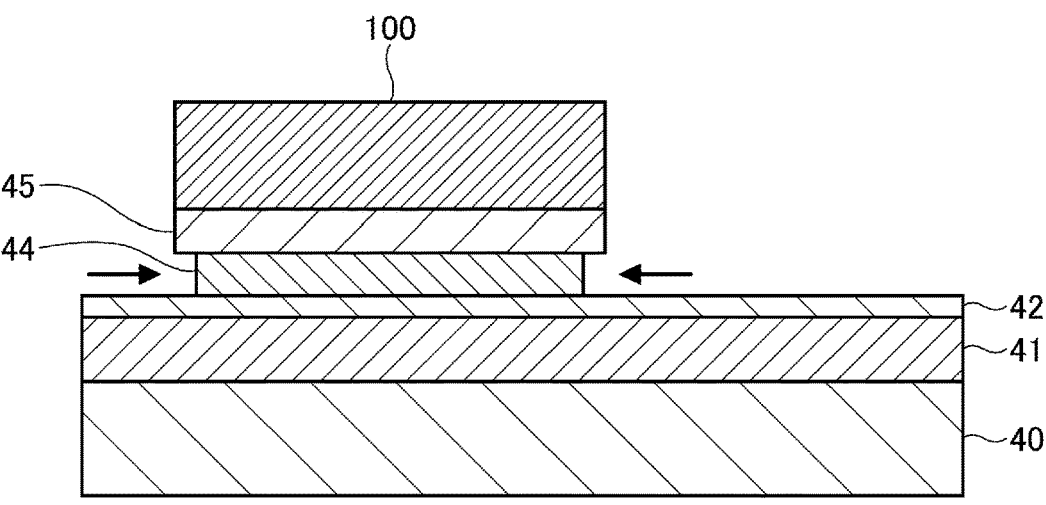
FIG. 11 is a diagram illustrating the method of manufacturing the semiconductor device according to the first embodiment.

As illustrated in FIG. 11, an i-InGaAs channel layer 44 is formed by selectively etching the InGaAs layer 44B to slightly make its horizontal width narrower than that of the n-InAlAs supply layer 45. The resist 100 is then removed.

Figure 12:
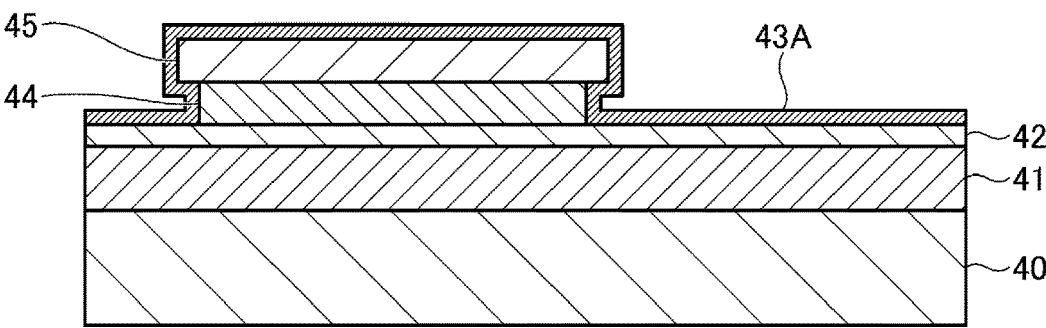
FIG. 12 is a diagram illustrating the method of manufacturing the semiconductor device according to the first embodiment.

As illustrated in FIG. 12, an entire structure in FIG. 11 obtained by chemical vapor deposition is covered with a SiO$_2$ film 43A.

Figure 13:
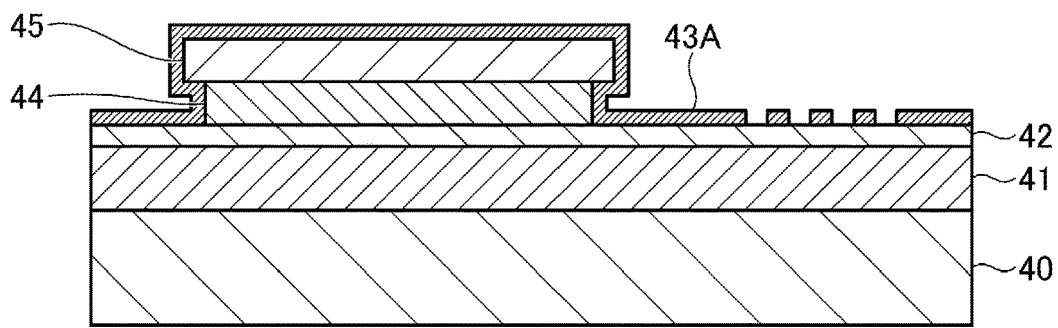
FIG. 13 is a diagram illustrating the method of manufacturing the semiconductor device according to the first embodiment.

As illustrated in FIG. 13, a resist (not illustrated) is formed covering a region other than a nanowire formation region by electron beam lithography, and multiple openings are formed in the SiO$_2$ film 43A by dry etching. After the openings are formed, the resist is removed. The diameter of the openings is approximately 50 nm to 200 nm, and the number and arrangement positions of the openings match the number and arrangement positions of the multiple nanowires 51. In order to facilitate the growth of the multiple nanowires 51, Au catalyst (approximately 10 nm thick) may be deposited and a lift-off process is performed to form a film of Au catalyst at the opening positions.

Figure 14:
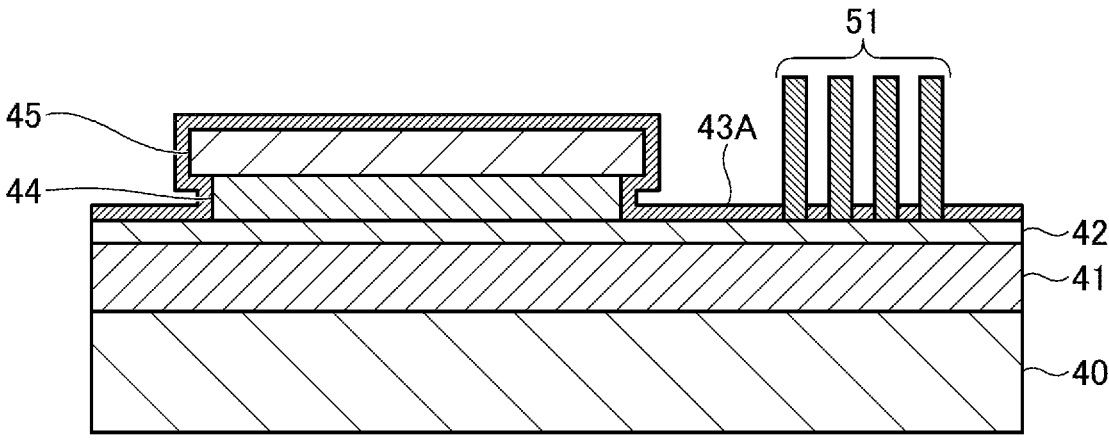
FIG. 14 is a diagram illustrating the method of manufacturing the semiconductor device according to the first embodiment.

As illustrated in FIG. 14, i-GaAs nanowires 51 are grown at the opening positions using an organometallic vapor deposition method. Specifically, when the substrate temperature is heated from 400 to 500 degrees Celsius, and triethylgallium (TEGa) and arsine (AsH$_3$) are supplied as the source gases, the source gases decompose and chemically react on the substrate surface, which allows the nanowires to grow by inheriting the crystal information of the base (i-GaAs layer 42). The height of the multiple nanowires 51 may be greater than or equal to the height of a mesa, and may be approximately 0.5 μm, for example.

Figure 15:
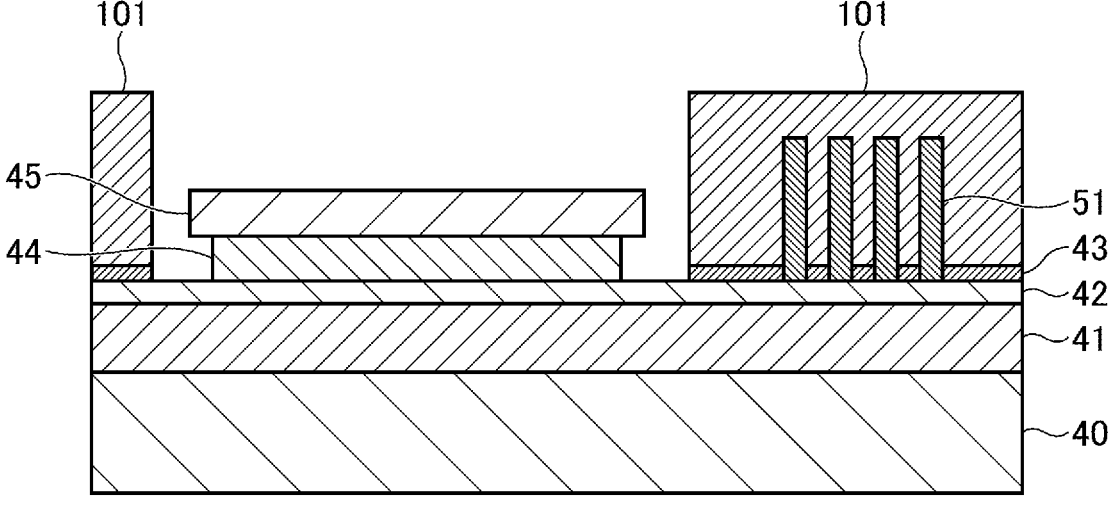
FIG. 15 is a diagram illustrating the method of manufacturing the semiconductor device 2C according to the first embodiment.

As illustrated in FIG. 15, a resist 101 covering a region other than a gate electrode region is formed by photolithography, and the SiO$_2$ film 43A is dry etched. This forms the SiO$_2$ layer 43.

Figure 16:
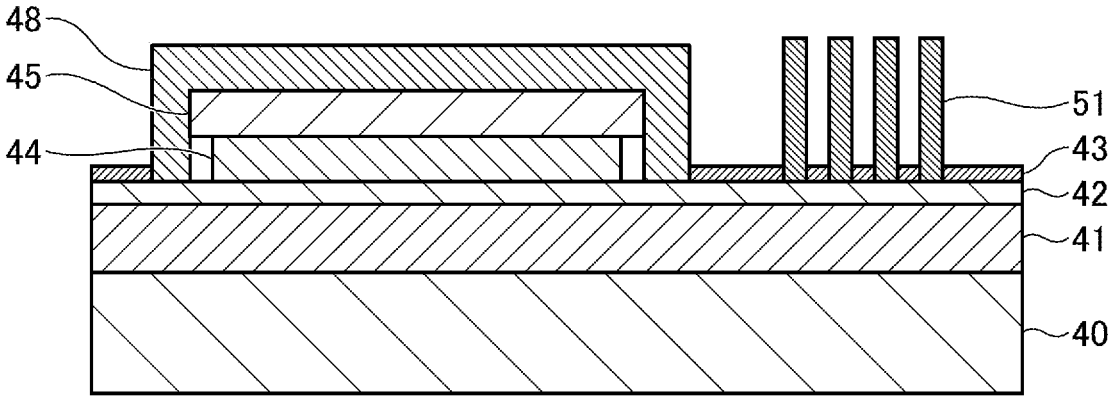
FIG. 16 is a diagram illustrating the method of manufacturing the semiconductor device according to the first embodiment.

As illustrated in FIG. 16, a gate electrode 48 (Ti/Pt/Au) is deposited and a lift-off process is performed. At this time, since a gap is formed between the gate electrode 48 and the i-InGaAs channel layer 44, an electrical short-circuit between the gate electrode 48 and the i-InGaAs channel layer 44 can be avoided. Note that the source electrode 46 (Ti/Pt/Au) and the drain electrode 47 (Ti/Pt/Au) are formed before the gate electrode 48 is formed at positions other than those illustrated in the cross-sectional view of FIG. 16.

Figure 17:
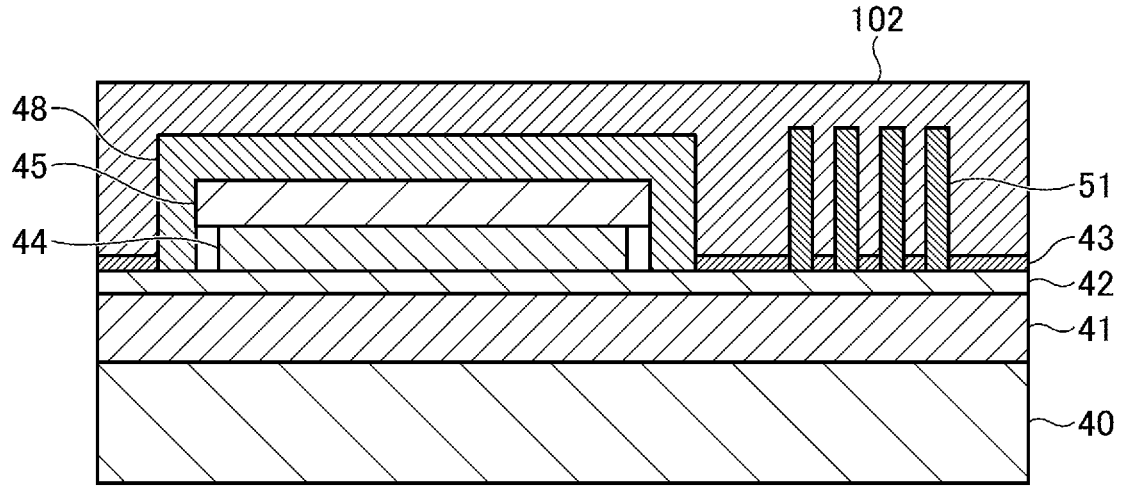
FIG. 17 is a diagram illustrating the method of manufacturing the semiconductor device according to the first embodiment.

As illustrated in FIG. 17, an entire upper side of the structure obtained in FIG. 16 is covered with a filler 102 such as PMGI (polydimethylglutamide), for example.

Figure 18:
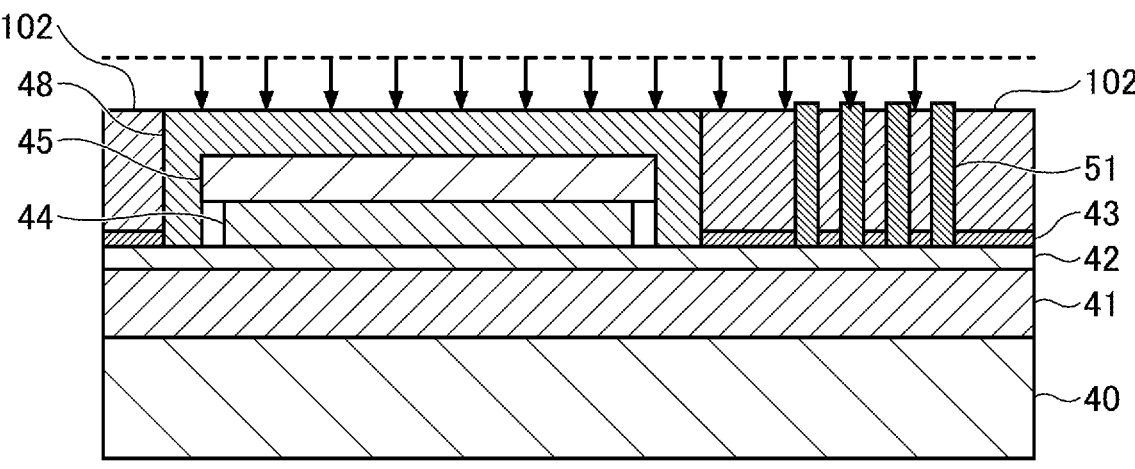
FIG. 18 is a diagram illustrating the method of manufacturing the semiconductor device according to the first embodiment.

As illustrated in FIG. 18, the filler 102 is subjected to etch back by dry etching to expose an upper surface of the gate electrode 48 and tips of the multiple nanowires 51.

Figure 19:
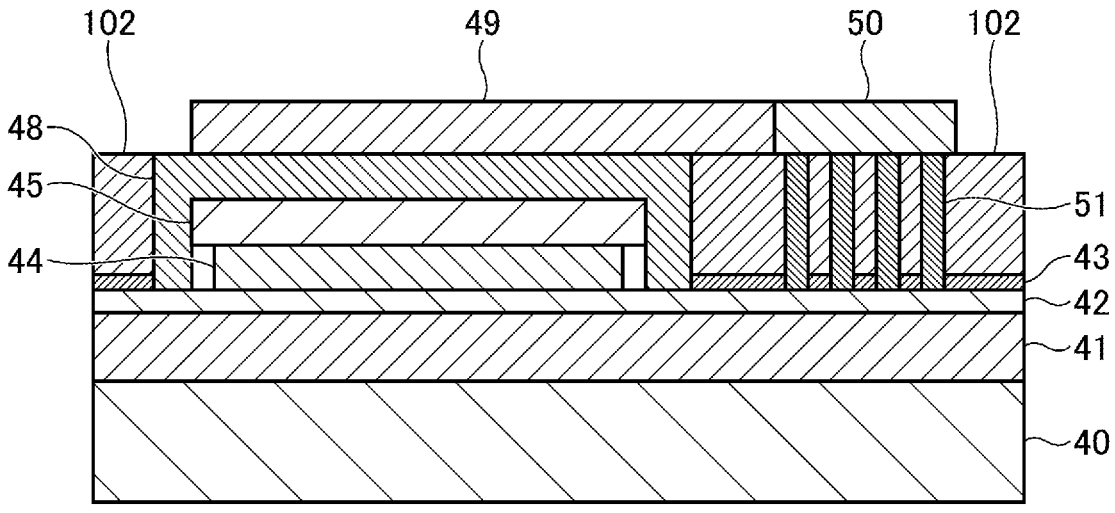
FIG. 19 is a diagram illustrating the method of manufacturing the semiconductor device according to the first embodiment.

As illustrated in FIG. 19, an extraction electrode 49 made of Ti/Au and an electrode pad 50 are disposed on the upper surfaces of the gate electrode 48, the filler 102, and the multiple nanowires 51. Specifically, resist formation by photolithography, electrode material formation by deposition, and a lift-off process are performed sequentially.

Figure 20:
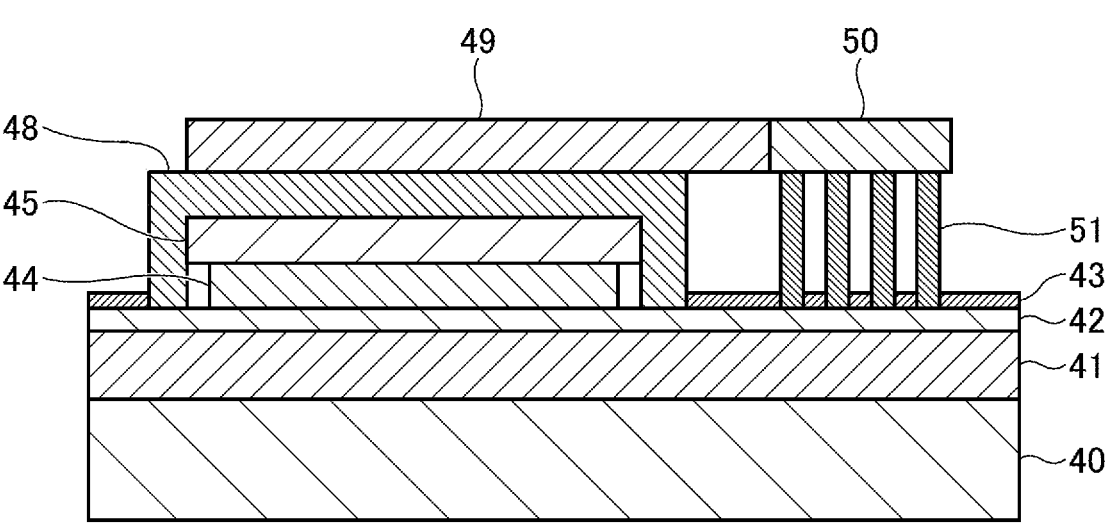
FIG. 20 is a diagram illustrating the method of manufacturing the semiconductor device according to the first embodiment.

As illustrated in FIG. 20, the filler 102 is all removed by dissolving the filler 102 with a solvent, including the filler 102 present in the region where the multiple nanowires 51 are arranged directly beneath the electrode pad 50. This configuration forms a gap between the electrode pad and the substrate, leaving only the thin multiple nanowires 51 between the electrode pad 50 and the substrate.

The above-described processes form a semiconductor device with a HEMT structure according to the first embodiment.

Figure 21:
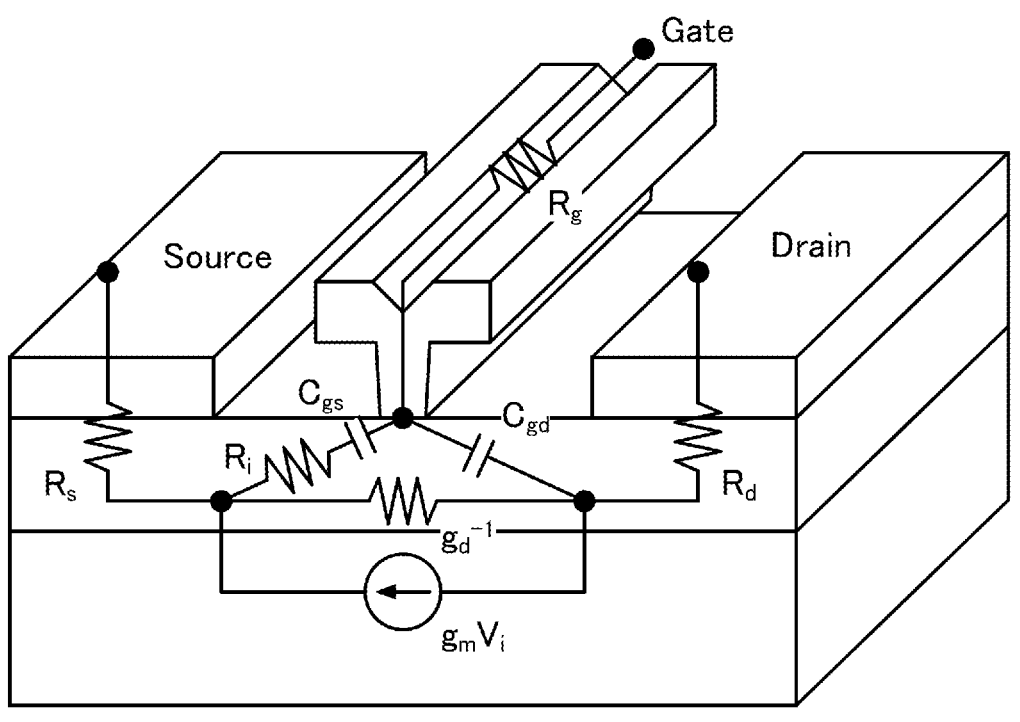
FIG. 21 is a diagram illustrating device parameters of a HEMT device.

FIG. 21 is a diagram illustrating device parameters of a HEMT device. Key parameters include source resistance $R_s$, gate resistance $R_g$, gate-source capacitance $C_{gs}$, gate-drain capacitance $C_{gd}$, and intrinsic transconductance $g_m^{int}$ (simply illustrated as $g_m$ in FIG. 21). Based on these parameters, the minimum noise figure $F_{min}$ is represented by the following equation (1):

[Equation 1]

-continued $$F_{min} = 1 + 2\pi K\left(\frac{f}{f_T}\right)\sqrt{g_m^{int}(R_s + R_g)} \qquad (1)$$

where K is the fitting coefficient, f is the frequency, and $f_T$ is the cutoff frequency. This $f_T$ is represented by the following equation (2) using device parameters:

[Equation 2]

$$f_T = g_m^{int}/2\pi(C_{gs} + C_{gd}) \qquad (2)$$

The equation (2) illustrates that $f_T$ increases when the gate-source capacitance $C_{gs}$ is reduced. Furthermore, the equation (1) illustrates that $F_{min}$ can be reduced when $f_T$ is increased. Therefore, it is effective to reduce the gate capacitance to reduce the noise of the amplifying device.

In the following, the noise FIG. represented by the equation (1) above is evaluated for the configuration in which the electrode pad is directly mounted on the substrate (e.g., the configuration illustrated in FIG. 6), and for the configuration in which the electrode pad is supported in an unfilled space by the multiple nanowires (the configurations illustrated in FIGS. 4, 5, 7, 8, etc.).

Table 1 below illustrates that a "conventional pad" corresponds to a configuration in which the electrode pad is directly mounted on the substrate, and a "nanowire pad" corresponds to a configuration in which the electrode pad is supported in an unfilled space by multiple nanowires.

TABLE 1

|  | CONVENTIONAL PAD 3 × 3 μm² | NANOWIRE PAD DIA. 0.2 μm, 49 PCS | NB |
|---|---|---|---|
| FINGER $C_{gs}$ (fF/mm) | 520 | 520 | |
| PAD $C_{gs}$ (fF/mm) | 315 | 54 | REDUCED TO 17% |
| $f_T$ (GHz) | 300 | 408 | |
| $F_{min}$@RT | 1.53 | 1.39 | |
| NOISE TEMPERATURE @4K (K) | 2.2 | 1.6 | REDUCED TO 73% |

The gate electrode can be roughly divided into finger and pad sections. In the measured transistor structure of the conventional pad, a gate finger width of the finger section was 80 μm, and the pad was square with a side length of 3 μm. In the dependence of the measured gate capacitance $C_{gs}$ on the gate length $L_g$, assuming that $L_g$ was 0, a value of 315 fF/mm was obtained for the gate capacitance $C_{gs}$. This value of 315 fF/mm corresponds to the pad parasitic capacitance in the absence of a gate finger. The overall gate capacitance measured was 835 fF/mm. Therefore, subtracting the above amount of pad parasitic capacitance, 520 (=835−315) fF/mm is the capacitance of the gate finger.

Assuming that a total of 49 nanowires with a diameter of 0.2 μm are arranged in 7 rows and 7 columns at a pitch of 0.5 μm, the cross-sectional area of the nanowires is 1.5386 (=0.1×0.1×3.14×49) μm². Since the area of a 3 μm×3 μm pad is 9 μm², the parasitic capacitance of the nanowire pad calculated by the area ratio is approximately 54 (=315× 1.5386/9) fF/mm. That is, as illustrated in Table 1, when focusing on the gate-to-source capacitance $C_{gs}$, the 54 fF/mm of the nanowire pad with respect to the 315 fF/mm of the conventional pad is reduced to 17%.

Using these values and estimating the $f_T$ for the nanowire pad based on the $f_T$=300 GHz measured for the transistor in the conventional pad 2C case, the $f_T$=408 GHz is obtained as illustrated in Table 1. That is, $f_T$=408 GHz for the nanowire pad is calculated by taking the gate-to-source capacitance $C_{gs}$ as 574 fF/mm, which is the sum of 54 fF/mm of the nanowire pad and 520 fF/mm of the finger section capacitance, and putting the gate-to-drain capacitance $C_{gd}$ (166 fF/mm) and intrinsic transconductance $g_m^{int}$ (0.152 S) into the equation (2).

Furthermore, by inputting the values of the gate-to-source capacitance $C_{gs}$ and the cutoff frequency $f_T$ obtained above, and other parameters into the equation (1), the noise figure $F_{min}$ can be obtained for the conventional pad and for the nanowire pad. Specifically, at a measurement frequency of 10 GHz, the noise figure $F_{min}$=1.53 for the conventional pad and $F_{min}$=1.39 for the nanowire pad at room temperature are calculated as illustrated in Table 1. Furthermore, the noise temperature calculated by $(F_{min}−1)$ K as a value at 4 K is illustrated in Table 1. As can be seen from Table 1, the noise temperature of the nanowire pad with respect to that of the conventional pad is reduced to 73%.

Table 2 illustrates the calculated values of the area coverage when nanowire columns are formed on a 3 μm×3 μm pad. The nanowire pitches of 0.5 μm, 1.0 μm, and 1.5 μm are illustrated, respectively.

TABLE 2

| NANOWIRE PITCH (μm) | 0.5 | 1.0 | 1.5 |
|---|---|---|---|
| NUMBER OF NANOWIRES (PCS) | 49 | 16 | 9 |
| NANOWIRE DIAMETER (nm) | 250 | 250 | 250 |
| OCCUPIED AREA (μm²) | 2.405 | 0.785 | 0.442 |
| COVERAGE (%) | 26.7 | 8.7 | 4.9 |

When the outermost nanowires are to be formed at the four corners and edges of the pad, the number of nanowires in each nanowire pitch is automatically determined to be 49, 16, and 9, based on a 3 μm×3 μm square region being targeted as a pad region. When the diameter of the nanowires is 250 nm as a larger value, the coverage is 26.7% in the case of a pitch of 0.5 μm. In this calculation, the coverage is estimated by assuming a larger value for the nanowire diameter. However, because the preferred nanowire diameter is as small as 50 nm to 200 nm as described above, the coverage is smaller than that illustrated in Table 2. In general, the coverage calculated as the total area of the nanowires relative to the area of the electrode pad is preferably 27% or less.

Figure 22:
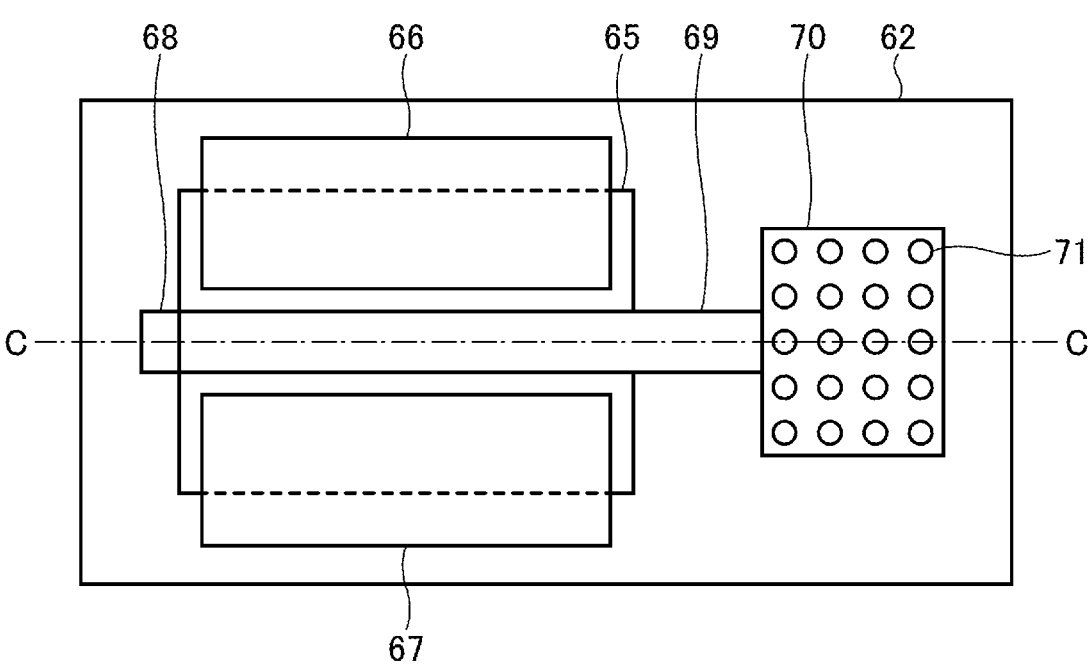
FIG. 22 is a top view illustrating an example of a configuration of a semiconductor device according to a second embodiment.
Figure 23:
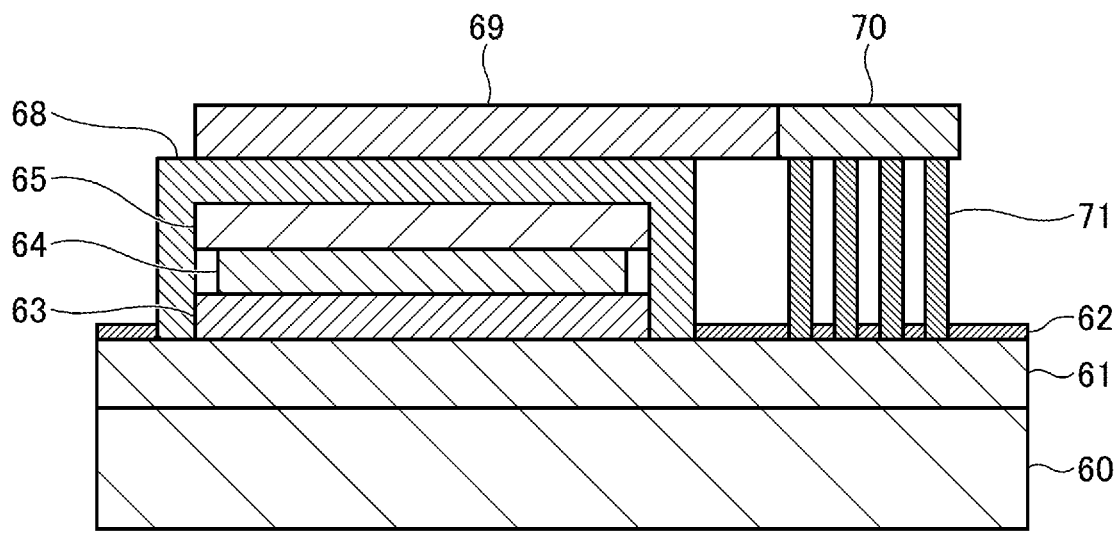
FIG. 23 is a cross-sectional view illustrating a cross section taken along a line C-C' of the semiconductor device illustrated in FIG. 22.

FIG. 22 is a top view illustrating an example of a configuration of a semiconductor device according to a second embodiment. FIG. 23 is a cross-sectional view illustrating a cross section taken along a line C-C' of the semiconductor device illustrated in FIG. 22.

The semiconductor device illustrated in FIGS. 22 and 23 includes a semi-insulating GaAs substrate 60, an i-GaAs buffer layer 61, a $SiO_2$ layer 62, an i-InAlGaAs buffer layer 63, an i-InGaAs channel layer 64, and an n-InAlAs supply layer 65. The semiconductor device further includes a source electrode 66, a drain electrode 67, a gate electrode 68, an extraction electrode 69, an electrode pad 70, and multiple nonconductive nanowires 71. The source electrode 66, the drain electrode 67, and the gate electrode 68 may all be Ti/Pt/Au. Although not illustrated, n-InGaAs may be provided directly beneath the source electrode 66 and the drain electrode 67 for a non-alloyed ohmic connection.

The semiconductor device according to the second embodiment illustrated in FIGS. 22 and 23 has basically the same configuration as the semiconductor device illustrated in FIG. 4. That is, the gate electrode 68, the source electrode 66, and the drain electrode 67 are arranged on (above) the substrate (GaAs substrate 60, i-GaAs buffer layer 61, and SiO$_2$ layer 62). The multiple nonconductive nanowires 71 are arranged two-dimensionally on an upper surface of the substrate so as to extend perpendicularly to the upper surface of the substrate. The electrode pad 70 is arranged at the upper ends of the multiple nanowires 71 so as to have a gap between the electrode pad and the substrate, and is supported by the multiple nanowires 71. The extraction electrode 69 electrically connects the electrode pad 70 to the gate electrode 68.

In the semiconductor device according to the second embodiment illustrated in FIGS. 22 and 23, the i-InGaAs channel layer 64 and the n-InAlAs supply layer 65 correspond to the active region. The gate electrode 68, the source electrode 66, and the drain electrode 67 are formed on the upper surface of the active region. The n-InAlAs supply layer 65 functions as an electron supply layer that supplies electrons, and the i-InGaAs channel layer 64 functions as an electron transport layer that transports electrons from the source electrode side to the drain electrode side. Thus, the semiconductor device according to the second embodiment has a HEMT structure.

The multiple nanowires 71 are formed by crystal growth of non-doped GaAs (i-GaAs). The nanowires 71 have substantially circular cross sections in a horizontal direction (more specifically, a prismatic shape according to a crystal structure) and the diameter is on the order of nanometers. The preferred diameter and pitch of the nanowires 71 are the same as in the first embodiment.

In the semiconductor device according to second embodiment, the substrate includes a first layer (i-GaAs buffer layer 61) made of the same material as the material (i-GaAs) used for the multiple nanowires 71, and lower ends of the multiple nanowires 71 are in contact with the first layer (i-GaAs buffer layer 61). By providing the i-GaAs buffer layer 61, the i-GaAs buffer layer 61 functions as a basis for crystal growth, enabling crystal growth of the multiple nanowires 71. By using an i-GaAs layer having an upper surface being a (111) B-plane, i.e., using an i-GaAs layer having a (111) B-plane orientation, the multiple nanowires 71 can grow in a vertical direction. The (111) B-plane orientation of the i-GaAs buffer layer 61 is implemented by using a GaAs substrate 60 with (111) B-plane orientation as the semi-insulating GaAs substrate 60.

In the semiconductor devices illustrated in FIGS. 22 and 23, the i-InAlGaAs buffer layer 63, the i-InGaAs channel layer 64, and the n-InAlAs supply layer 65 are separated by mesa etching. The i-InGaAs channel layer 64 is shorter than the n-InAlAs supply layer 65 in a lateral direction of the figures. This configuration is to prevent the gate electrode 68 formed on the sides as well as the upper surface of the active region from being electrically short-circuited with the i-InGaAs channel layer 64.

Note that the crystal of the i-GaAs buffer layer 61 and the crystal of the i-InGaAs channel layer 64 exhibit mismatched lattice constants. Therefore, when the i-InGaAs channel layer 64 is directly formed on the upper surface of the i-GaAs buffer layer 61, it is difficult to stably grow crystals of i-InGaAs channel layer 64 with low strain. To mitigate this lattice constant mismatch, the i-InAlGaAs buffer layer 63 is formed.

Figure 24:
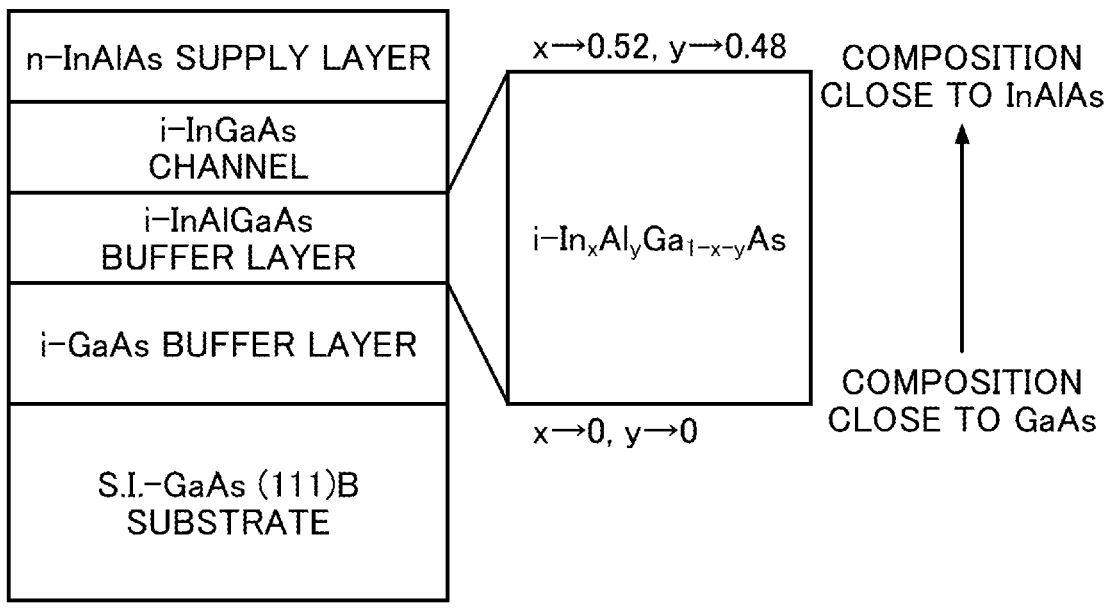
FIG. 24 is a diagram illustrating a method 2C of manufacturing a semiconductor device according to a second embodiment.

FIG. 24 is a diagram illustrating an example of a configuration of the i-InAlGaAs buffer layer 63. As illustrated in FIG. 24, the i-InAlGaAs buffer layer 63 has a gradually varying composition along its thickness direction. That is, when the composition of the i-InAlGaAs buffer layer 63 is i-In$_x$A$_{1y}$Ga$_{1-x-y}$As, values of x and y are gradually changed along the thickness direction of the layer. Specifically, the values of x and y are gradually changed along the thickness direction of the layer so that x and y are close to 0 on the i-GaAs buffer layer 61 side, and x is close to 0.52 and y is close to 0.48 on the i-InGaAs channel layer 64 side. By providing such an i-InAlGaAs buffer layer 63, crystal defects are less likely to occur in the i-InGaAs channel layer 64, and the i-InGaAs channel layer 64 can grow stably.

A method of manufacturing the semiconductor device according to the second embodiment illustrated in FIGS. 22 and 23 is described in detail below.

Figure 25:
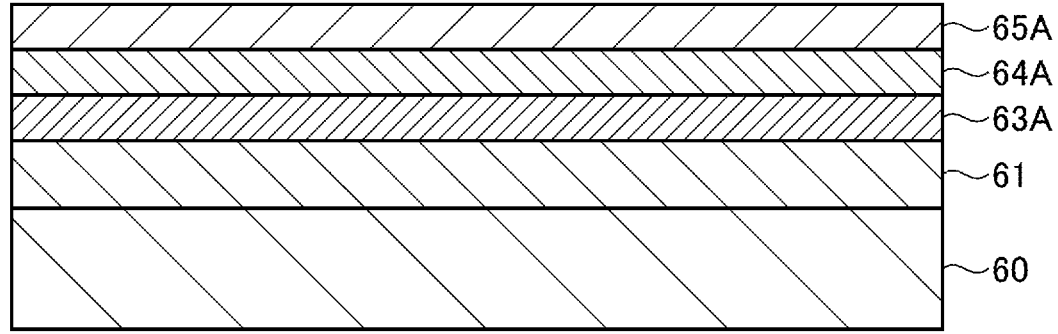
FIG. 25 is a diagram illustrating the method of manufacturing the semiconductor device according to the second embodiment.

As illustrated in FIG. 25, an i-GaAs buffer layer 61, an i-InAlGaAs layer 63A, an i-InGaAs layer 64A, and an n-InAlAs layer 65A are sequentially grown on the semi-insulating GaAs substrate 60 with a (111) B-plane orientation. The thickness of each layer is, for example, 200 nm for the i-GaAs buffer layer 61, 500 nm for the i-InAlGaAs layer 63A, 10 nm for the i-InGaAs layer 64A, and 8 nm for the n-InAlAs layer 65A. The doping concentration of the n-InAlAs layer 65A may be, for example, 1e19 cm$^{-3}$.

Figure 26:
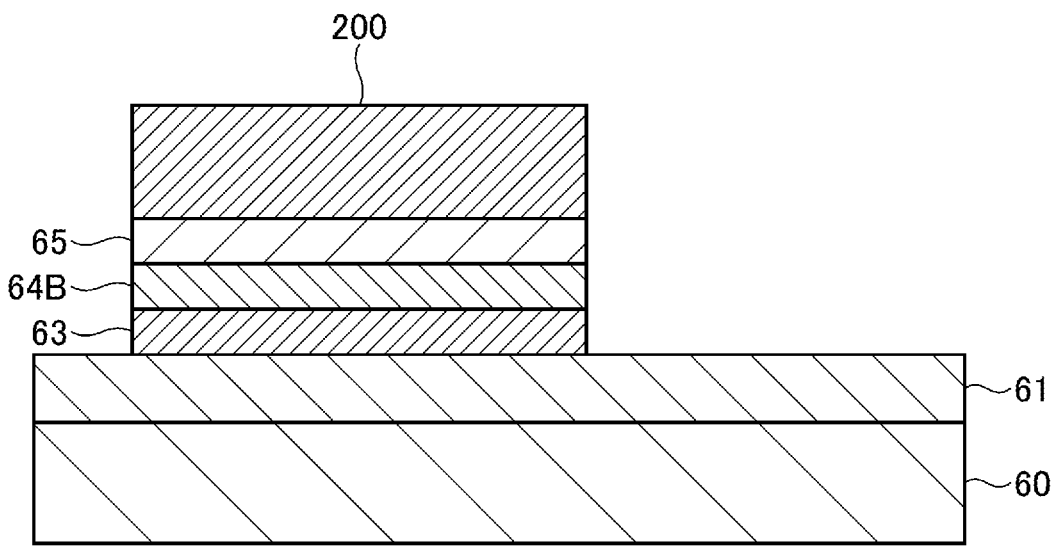
FIG. 26 is a diagram illustrating the method of manufacturing the semiconductor device according to the second embodiment.

In FIG. 26, a resist 200 covering an active region is formed by photolithography, and the i-InAlGaAs layer 63A, the i-InGaAs layer 64A, and the n-InAlAs layer 65A are wet etched to form a mesa-structured element separation. That is, the i-InAlGaAs layer 63A, the i-InGaAs layer 64A, and the n-InAlAs layer 65A are wet etched to form an i-InAlGaAs buffer layer 63, an i-InGaAs layer 64B, and an n-InAlAs supply layer 65.

Figure 27:
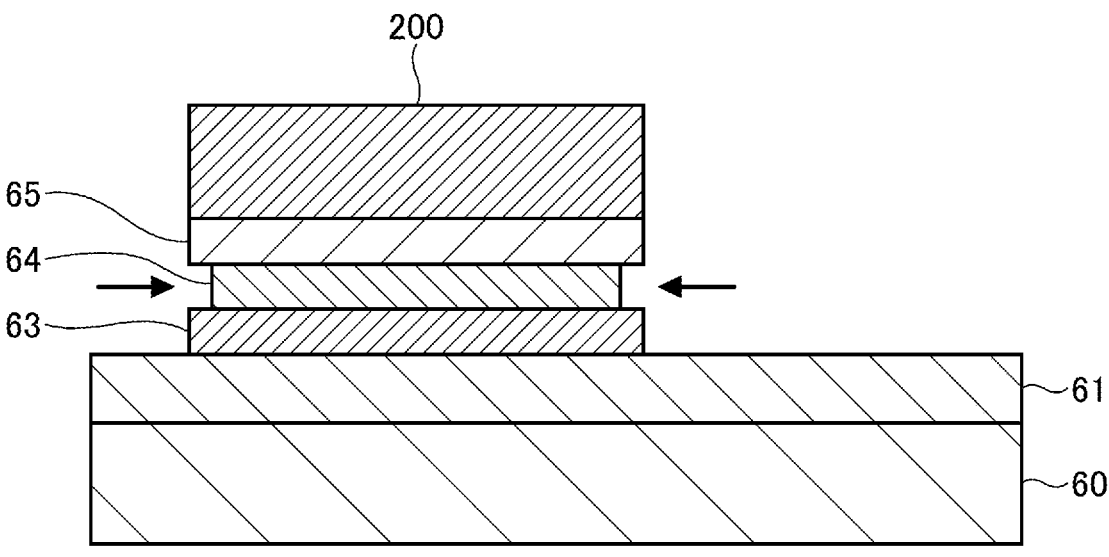
FIG. 27 is a diagram illustrating the method of manufacturing the semiconductor device according to the second embodiment.

As illustrated in FIG. 27, the i-InGaAs channel layer 64 is formed by selectively etching the i-InGaAs layer 64B to slightly make its horizontal width narrower than that of the n-InAlAs supply layer 65. The resist 200 is then removed.

Figure 28:
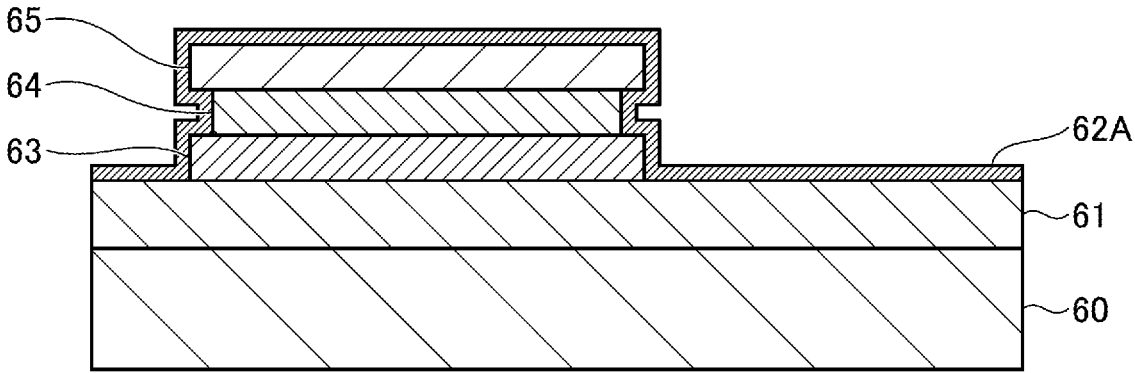
FIG. 28 is a diagram illustrating the method of manufacturing the semiconductor device according to the second embodiment.

As illustrated in FIG. 28, an entire structure in FIG. 27 obtained by chemical vapor deposition is covered with a SiO$_2$ film 62A.

Figure 29:
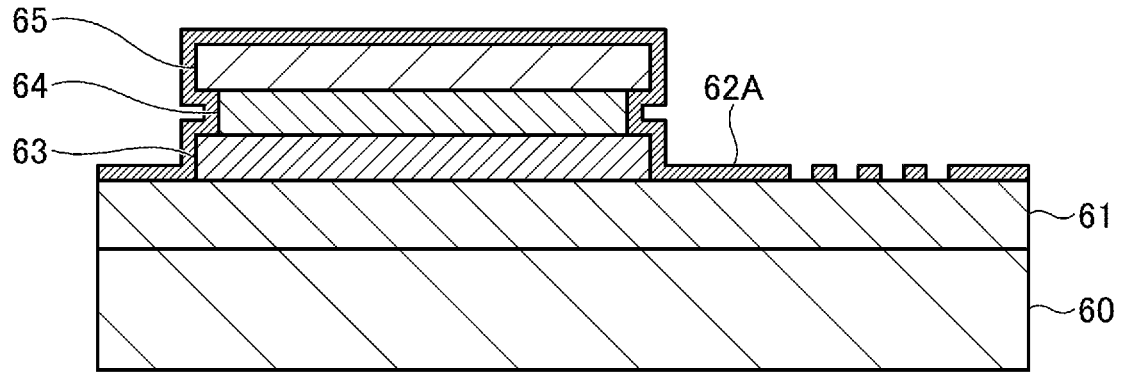
FIG. 29 is a diagram illustrating the method of manufacturing the semiconductor device according to the second embodiment.

As illustrated in FIG. 29, a resist (not illustrated) is formed covering a region other than a nanowire formation region by electron beam lithography, and multiple openings are formed in the SiO$_2$ film 62A by dry etching. After the openings are formed, the resist is removed. The diameter of the openings is approximately 50 nm to 200 nm, and the number and arrangement positions of the openings match the number and arrangement positions of the multiple nanowires 71. In order to facilitate the growth of the multiple nanowires 71, Au catalyst (approximately 10 nm thick) may be deposited and a lift-off process is performed to form a film of Au catalyst at the opening positions.

Figure 30:
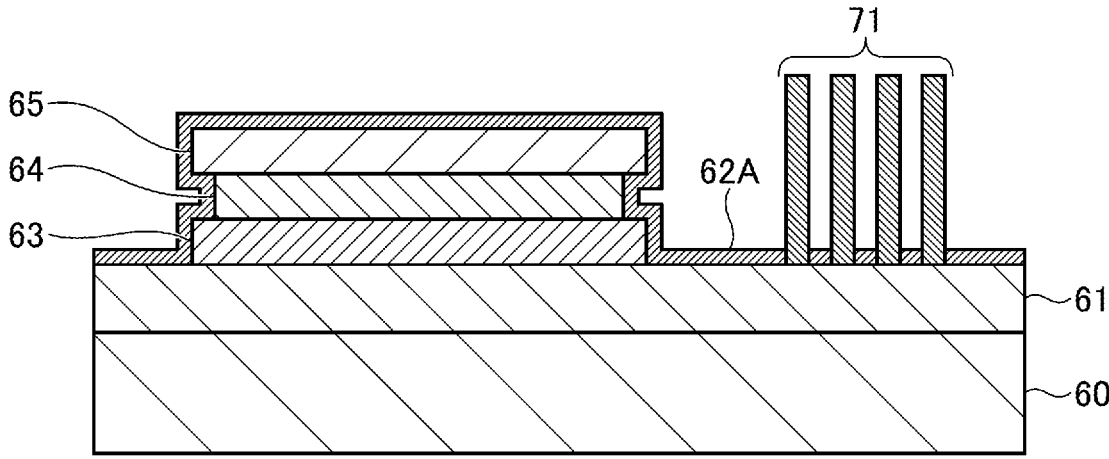
FIG. 30 is a diagram illustrating the method of manufacturing the semiconductor device according to the second embodiment.

As illustrated in FIG. 30, i-GaAs nanowires 71 are grown at opening positions using an organometallic vapor deposition method. Specifically, when the substrate temperature is heated from 400 to 500 degrees Celsius, and triethylgallium (TEGa) and arsine (AsH$_3$) are supplied as the source gases, the source gases decompose and chemically react on the substrate surface, which allows the nanowires to grow by inheriting the crystal information of the base (i-GaAs buffer layer 61). The height of the multiple nanowires 71 may be greater than or equal to the height of a mesa, and may be, for example, approximately 0.8 μm.

Figure 31:
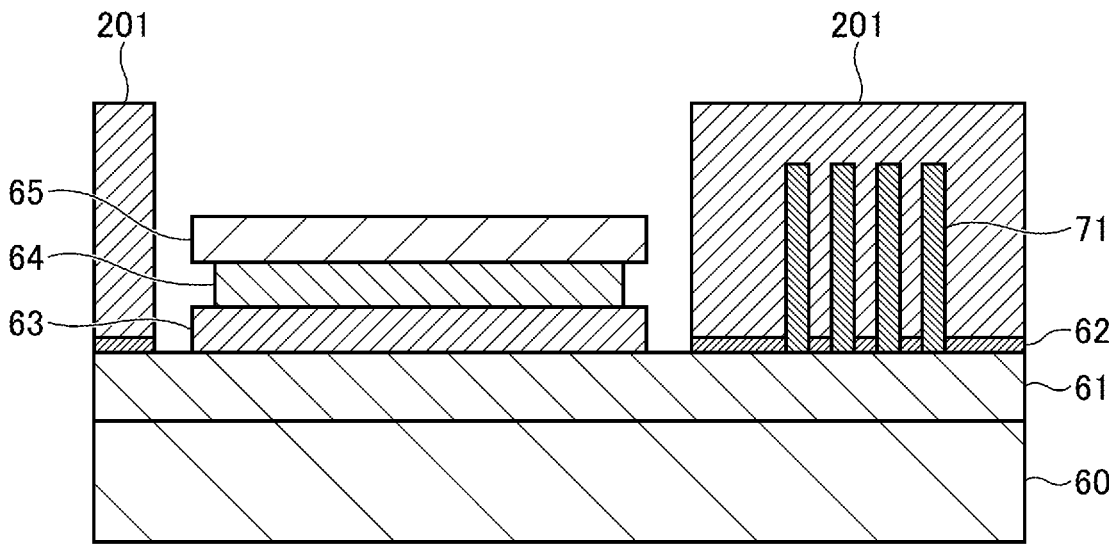
FIG. 31 is a diagram illustrating the method of manufacturing the semiconductor device according to the second embodiment.

As illustrated in FIG. 31, a resist 201 covering a region other than a gate electrode region is formed by photolithography, and the SiO$_2$ film 62A is dry etched. This forms the SiO$_2$ layer 62.

Figure 32:
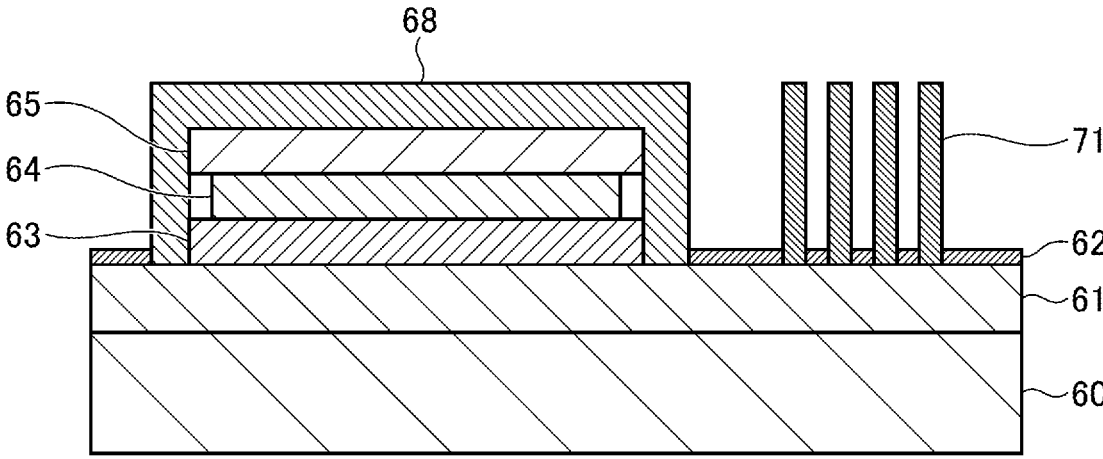
FIG. 32 is a diagram illustrating the method of manufacturing the semiconductor device 2C according to the second embodiment.

As illustrated in FIG. 32, a gate electrode 68 (Ti/Pt/Au) is deposited and a lift-off process is performed. At this time, since a gap is formed between the gate electrode 68 and the i-InGaAs channel layer 64, an electrical short-circuit between the gate electrode 68 and the i-InGaAs channel layer 64 can be avoided. Note that the source electrode 66 (Ti/Pt/Au) and the drain electrode 67 (Ti/Pt/Au) are formed before the gate electrode 68 is formed at positions other than those illustrated in the cross-sectional view of FIG. 32.

Figure 33:
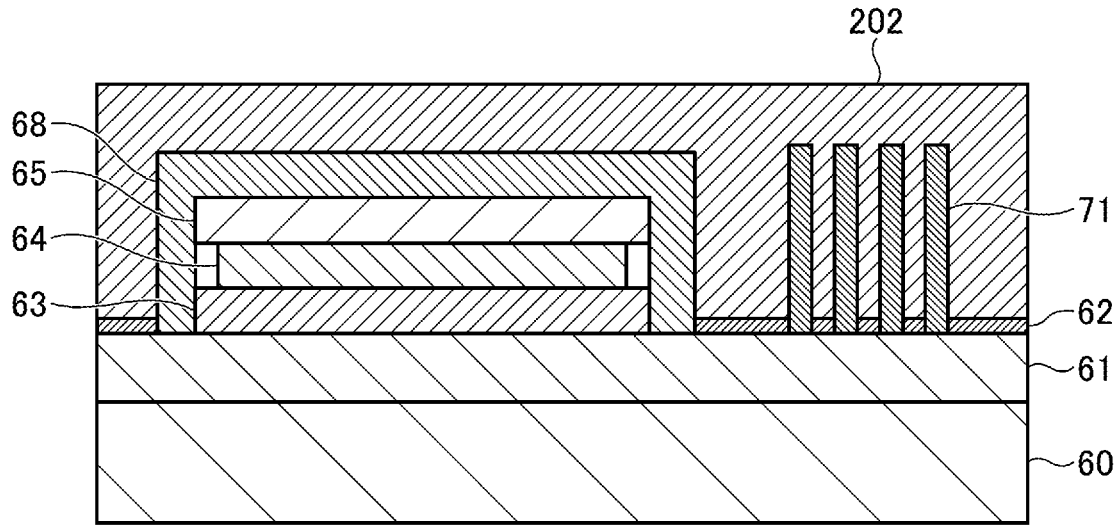
FIG. 33 is a diagram illustrating the method of manufacturing the semiconductor device according to the second embodiment.

As illustrated in FIG. 33, an entire upper side of the structure obtained in FIG. 32 is covered with a filler 202 such as PMGI, for example.

Figure 34:
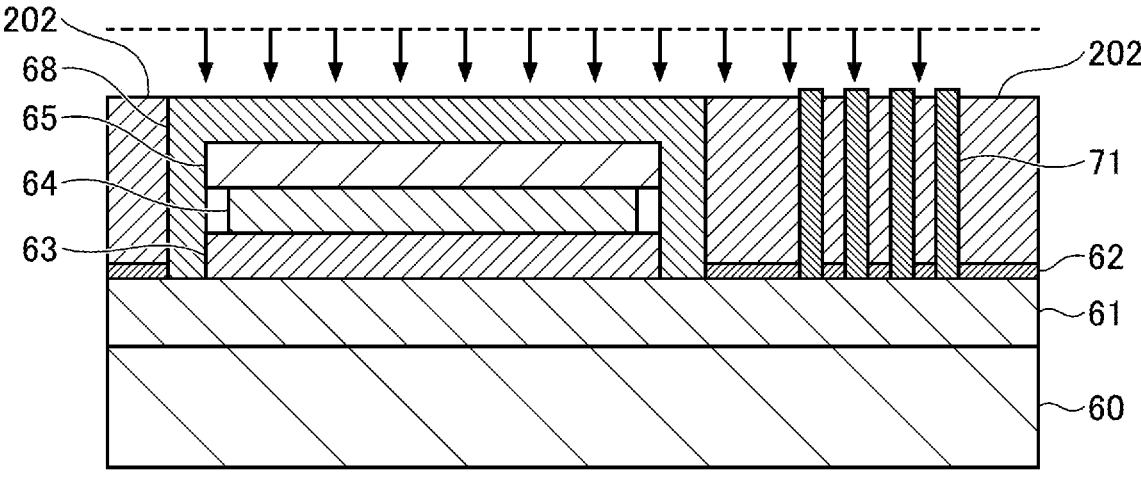
FIG. 34 is a diagram illustrating the method of manufacturing the semiconductor device according to the second embodiment.

As illustrated in FIG. 34, the filler 202 is subjected to etch back by dry etching to expose an upper surface of the gate electrode 68 and tips of the multiple nanowires 71.

Figure 35:
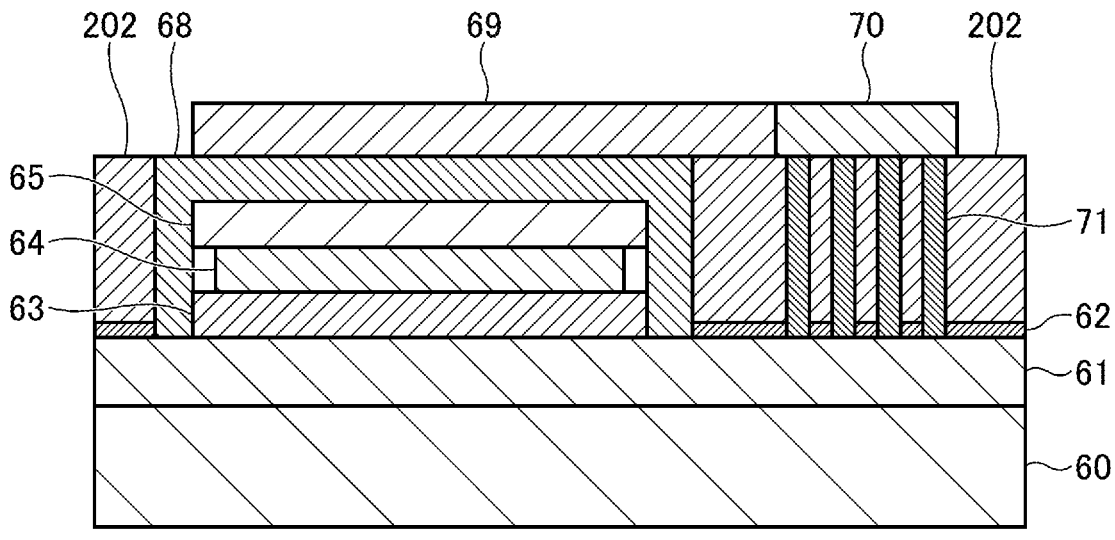
FIG. 35 is a diagram illustrating the method of manufacturing the semiconductor device according to the second embodiment.

As illustrated in FIG. 35, an extraction electrode 69 made of Ti/Au and an electrode pad 70 are disposed on upper surfaces of the gate electrode 68, the filler 202, and the multiple nanowires 71. Specifically, resist formation by photolithography, electrode material formation by deposition, and a lift-off process are performed sequentially.

Figure 36:
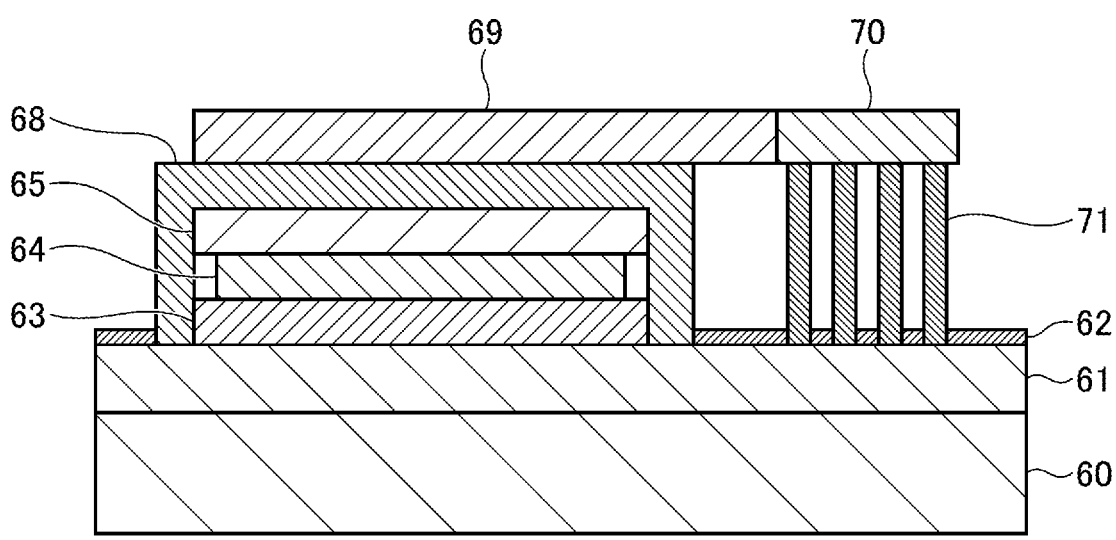
FIG. 36 is a diagram illustrating the method of manufacturing the semiconductor device according to the second embodiment.

As illustrated in FIG. 36, the filler 202 is all removed by dissolving the filler 202 with a solvent, including the filler 202 present in the region where the multiple nanowires 71 are arranged directly beneath the electrode pad 70. This configuration forms a gap between the electrode pad 70 and the substrate, leaving only the thin multiple nanowires 71 between the electrode pad 70 and the substrate.

The above-described processes form a semiconductor device with a HEMT structure according to the second embodiment.

Figure 37:
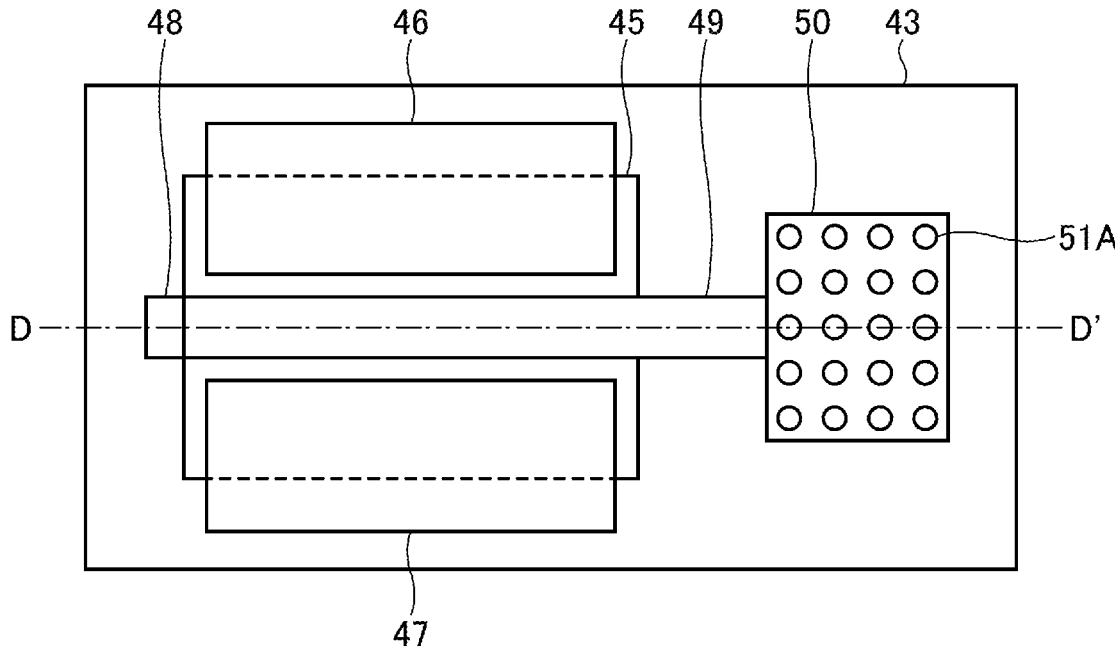
FIG. 37 is a top view illustrating an example of a configuration of a semiconductor device according to a third embodiment.
Figure 38:
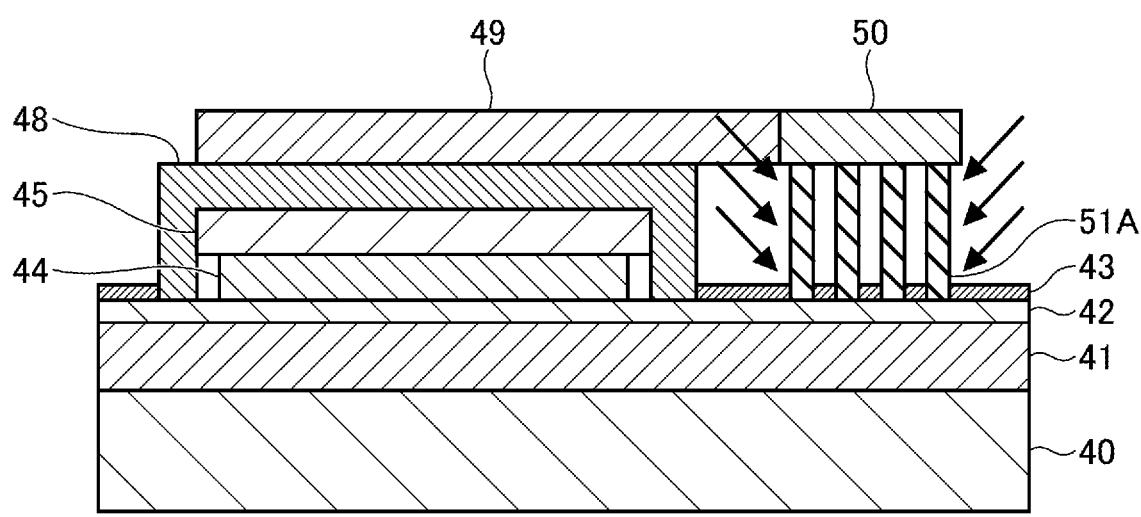
FIG. 38 is a cross-sectional view illustrating a cross section taken along a line D-D' of the semiconductor device illustrated in FIG. 37.

FIG. 37 is a top view illustrating an example of a configuration of a semiconductor device according to a third embodiment. FIG. 38 is a cross-sectional view illustrating a cross section taken along a line D-D' of the semiconductor device illustrated in FIG. 37.

The semiconductor device according to the third embodiment illustrated in FIGS. 37 and 38 differs from the semiconductor device according to the first embodiment illustrated in FIGS. 7 and 8 only in that the multiple nanowires 51 are replaced with multiple nanowires 51A. Other configurations are identical between the first and third embodiments.

The material for the multiple nanowires 51 in the first embodiment is impurity-free i-GaAs, while the material for the multiple nanowires 51A in the third embodiment is GaAs, which is conductivity type-independent (i.e., it may include impurities). However, in order to remove the conductivity of the multiple nanowires 51A resulting from impurities, defects are introduced into the nanowires by performing an ion implantation process on the multiple nanowires 51A, as schematically illustrated by multiple arrows in FIG. 38. Carriers resulting from impurities contained in GaAs can be trapped by these defects to make the multiple nanowires 51A nonconductive.

As described above, in the third embodiment, the multiple nanowires 51A are made of semiconductors deactivated by introducing defects. Therefore, when an inspection reveals that the multiple nanowires 51A are conductive in a manufactured semiconductor device, an ion implantation process can be incorporated into a manufacturing process to ensure that the nanowires are nonconductive in the semiconductor device to be manufactured thereafter.

A method of manufacturing the semiconductor device according to the third embodiment illustrated in FIGS. 37 and 38 will be described in detail below.

In the manufacturing process of the third embodiment, the same manufacturing process as that of the first embodiment illustrated in FIGS. 7 to 13 is performed first.

Figure 39:
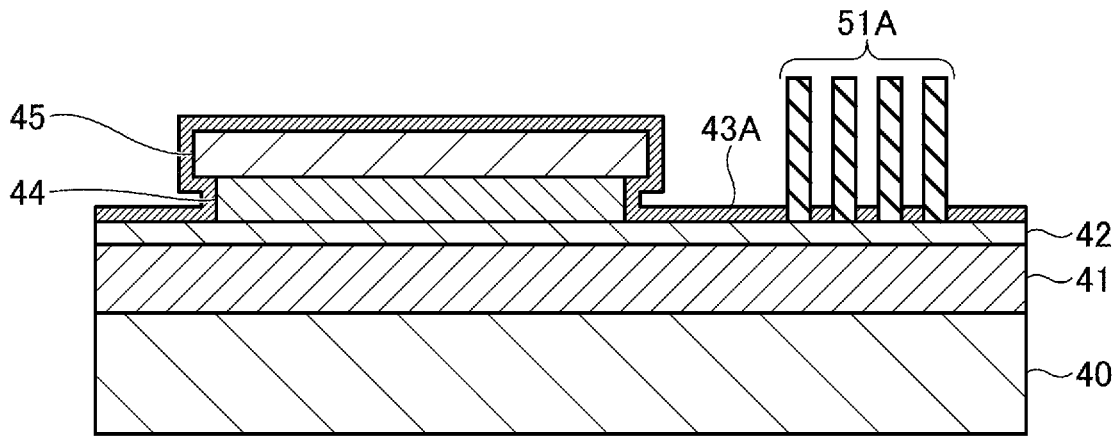
FIG. 39 is a diagram illustrating a method of manufacturing the semiconductor device according to the third embodiment.

Then, as illustrated in FIG. 39, nanowires 51A of, for example, n-GaAs (5e17 cm$^{-3}$) are grown at opening positions using an organometallic vapor deposition method. The height of the multiple nanowires 51A may be higher than the mesa, and may be, for example, approximately 0.5 μm.

Figure 40:
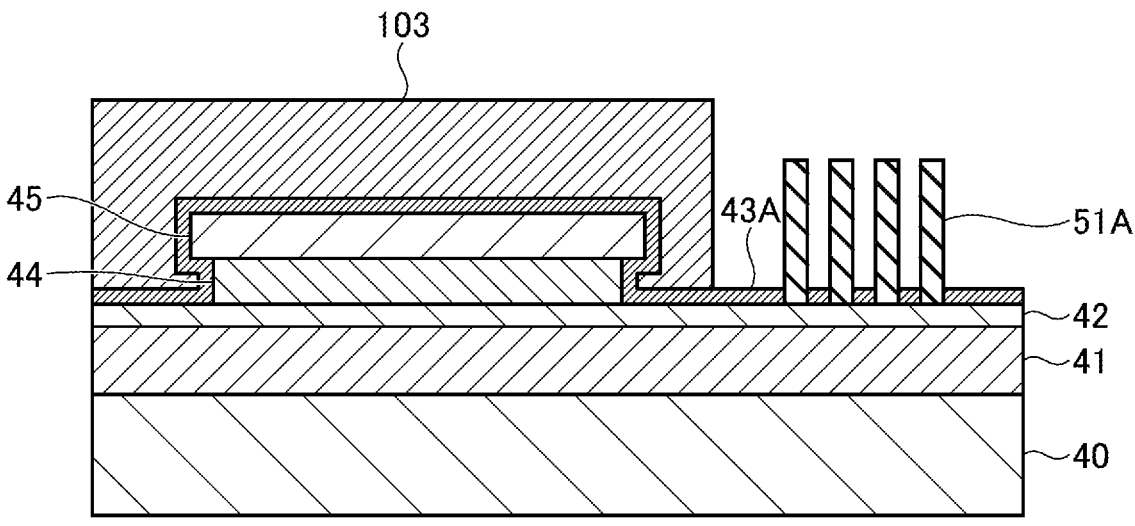
FIG. 40 is a diagram illustrating the method of manufacturing the semiconductor device according to the third embodiment.

As illustrated in FIG. 40, a resist 103 covering a region other than a gate electrode region is formed by photolithography.

Figure 41:
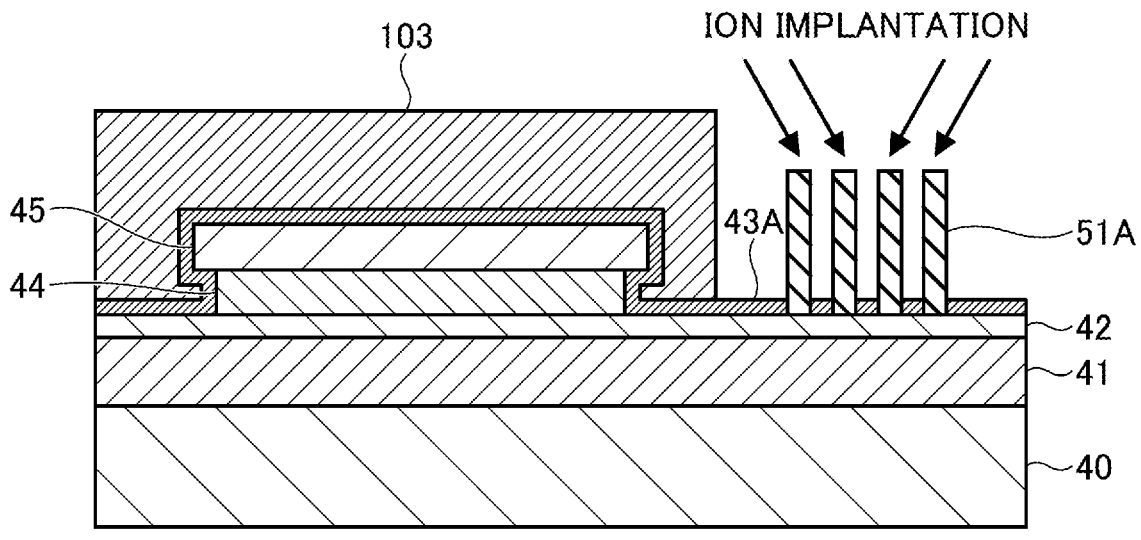
FIG. 41 is a diagram illustrating the method of manufacturing the semiconductor device according to the third embodiment.

As illustrated in FIG. 41, by implanting oxygen ions into the nanowires 51A at an angle to the vertical direction, defects are introduced into the nanowires 51A to compensate the carriers. After the ion implantation process, the resist 103 is removed.

Then, the semiconductor device according to the third embodiment is completed by executing the same manufacturing process as that of the first embodiment illustrated in FIGS. 15 to 20.

Figure 42:
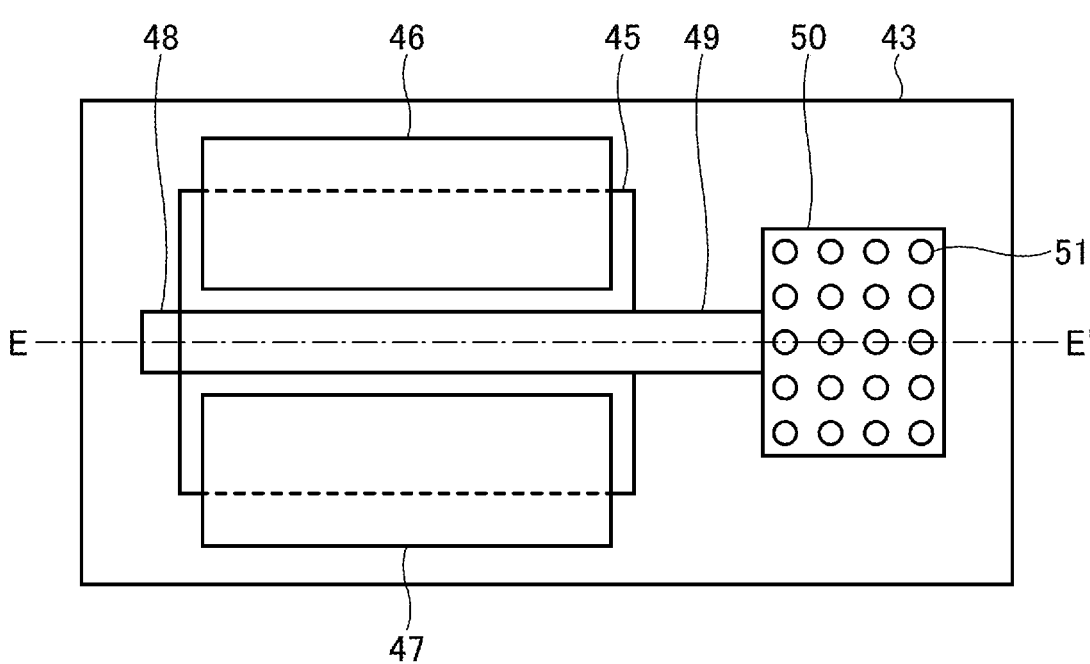
FIG. 42 is a top view illustrating an example of a configuration of a semiconductor device according to a fourth embodiment.
Figure 43:
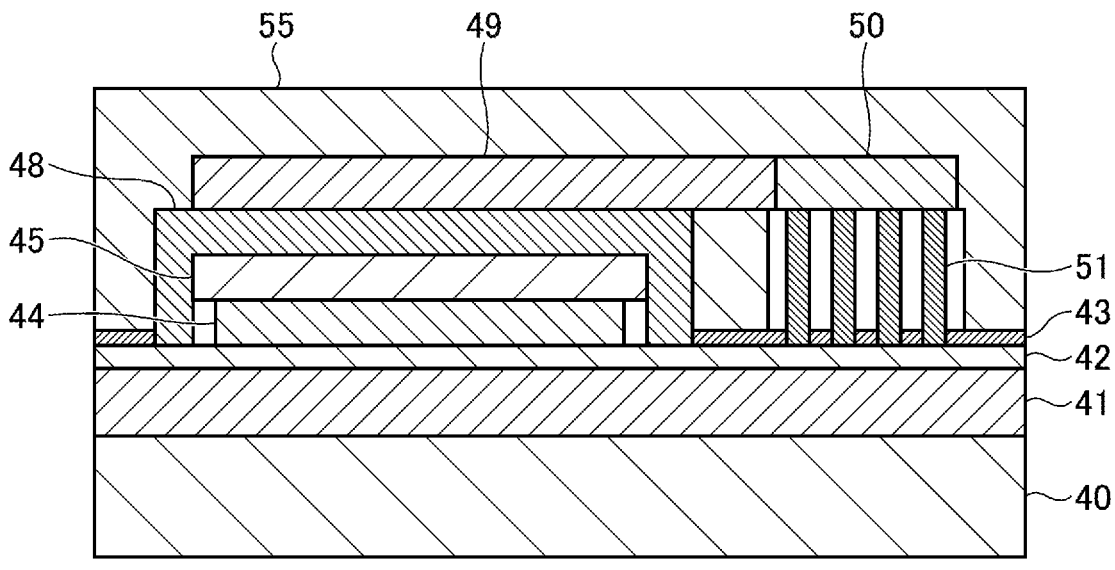
FIG. 43 is a cross-sectional view illustrating a cross section taken along a line E-E' of the semiconductor device illustrated in FIG. 42.

FIG. 42 is a top view illustrating an example of a configuration of a semiconductor device according to a fourth embodiment. FIG. 43 is a cross-sectional view illustrating a cross section taken along a line E-E' of the semiconductor device illustrated in FIG. 42.

The semiconductor device according to the fourth embodiment illustrated in FIGS. 42 and 43 differs from the semiconductor device according to the first embodiment illustrated in FIGS. 7 and 8 only in that an interlayer insulating film 55 is provided. Other configurations are identical between the first and fourth embodiments.

The semiconductor device according to the fourth embodiment includes an insulating film disposed over a substrate (more specifically, on a substrate, a transistor, and an electrode pad, etc.). By using this insulating film as an interlayer insulating film, an additional circuit can be formed on an upper surface of an interlayer insulating film. Also, because an insulating film 55 has a gap at positions of the multiple nanowires 51, at least some of the multiple nanowires 51 are not in contact with the insulating film 55. This makes it possible to provide an empty space between the electrode pad 50 and the dielectric substrate, while the interlayer insulating film is still provided, thereby reducing the parasitic capacitance generated by the substrate made of a semiconductor with a high dielectric constant, which is present under the electrode pad 50. Therefore, noise in the signal input to the transistor can be reduced.

A method of manufacturing the semiconductor device according to the fourth embodiment illustrated in FIGS. 42 and 43 will be described in detail below.

In the manufacturing process of the fourth embodiment, the same manufacturing process as that of the first embodiment illustrated in FIGS. 7 to 19 is performed first.

Figure 44:
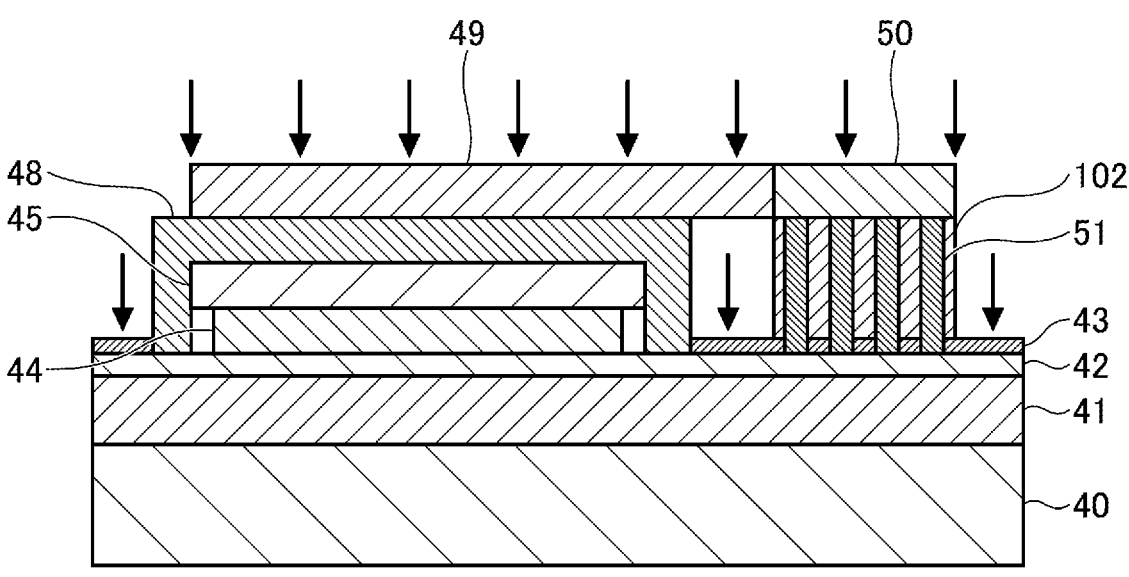
FIG. 44 is a diagram illustrating a method of manufacturing the semiconductor device according to the fourth embodiment.

The filler 102 (see FIG. 19) is then removed by dry etching, as illustrated in FIG. 44. At this time, the filler 102 remains only directly beneath the electrode pad 50. A resist covering the position of the electrode pad 50 may be formed by photolithography to ensure that the filler 102 remains directly beneath the electrode pad 50, and the resist may be removed thereafter.

Figure 45:
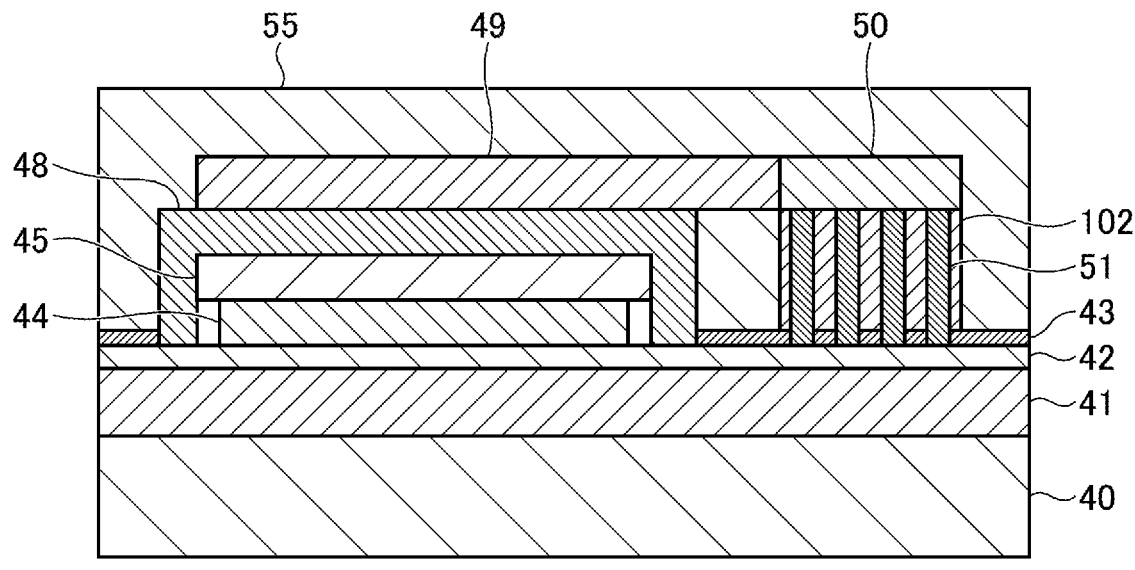
FIG. 45 is a diagram illustrating the method of manufacturing the semiconductor device according to the fourth embodiment.

As illustrated in FIG. 45, an insulating film 55 made of, for example, BCB (benzocyclobutene) is formed to cover an entire upper side of the structure obtained in FIG. 44. This enables the insulating film 55 to cover each member such as the gate electrode 48, the extraction electrode 49, and the electrode pad 50, including the filler 102 remaining to surround the multiple nanowires 51.

Figure 46:
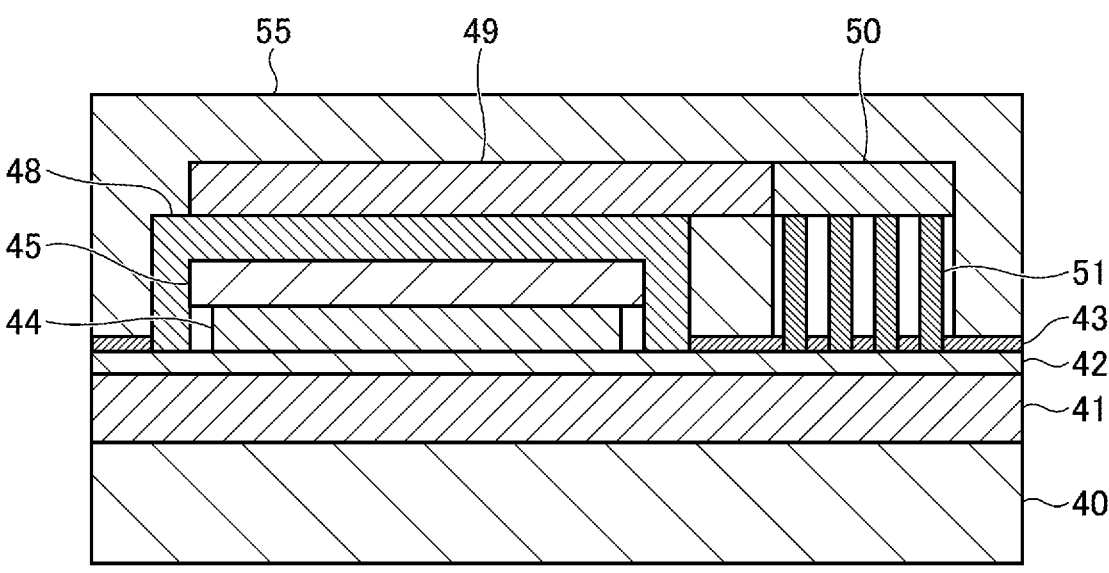
FIG. 46 is a diagram illustrating the method of manufacturing the semiconductor device according to the fourth embodiment.

As illustrated in FIG. 46, the filler 102 present in a region where the multiple nanowires 51 are arranged directly beneath the electrode pad 50 is removed by dissolving the filler 102 with a solvent. Specifically, holes are formed from the upper surface of the insulating film 55 to reach the filler 102, and the filler 102 is dissolved and removed by pouring a solvent into the holes. As a result, a gap is formed between the electrode pad 50 and the substrate, and only the thin nanowires 51 exist between the electrode pad 50 and the substrate.

Figure 47:
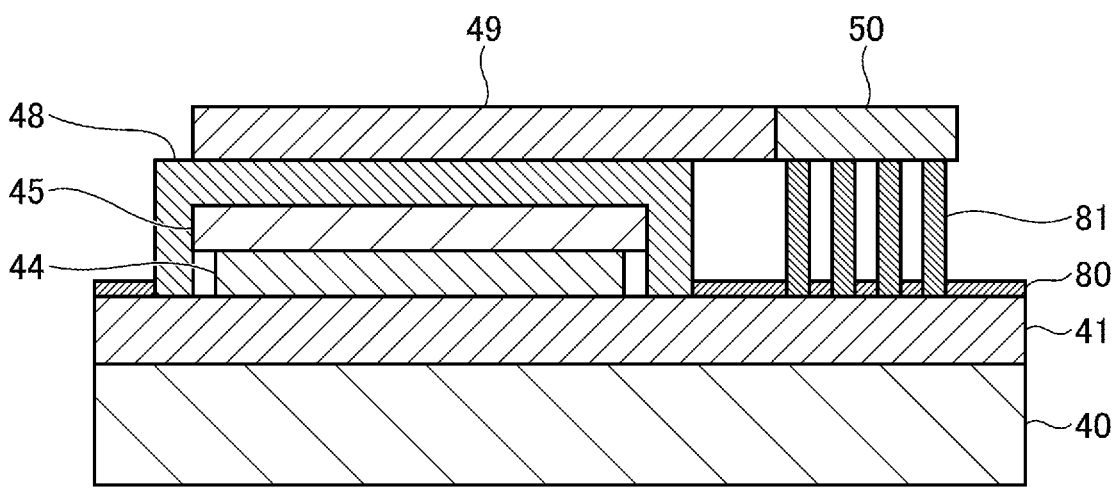
FIG. 47 is a cross-sectional view illustrating an example of a configuration of a semiconductor device according to a fifth embodiment.

FIG. 47 is a cross-sectional view illustrating an example of a configuration of a semiconductor device according to a fifth embodiment.

The semiconductor device according to the fifth embodiment illustrated in FIG. 47 differs from the semiconductor device according to the first embodiment only in that the multiple nanowires 51 are replaced with multiple nanowires 81, the i-GaAs layer 42 is removed, and an $AlO_2$ layer 80 is provided instead of the $SiO_2$ layer 43. Other configurations are identical between the first embodiment and the fifth embodiment.

In the semiconductor device according to the fifth embodiment, the multiple nanowires 81 are made of insulators. That is, the multiple nanowires 81 are not made of semiconductors such as i-GaAs but are made of insulating materials. The material for the multiple nanowires 81 may be BCB, for example, and may be formed by dry etching. In order to enable selective etching, an $AlO_2$ layer 80 is provided as a protective film in place of the $SiO_2$ layer 43. This configuration does not require the i-GaAs layer 42, which is provided in the semiconductor device according to the first embodiment, because the i-GaAs nanowires do not need to be grown.

Also, in the fifth embodiment, the nonconductive nanowires 81, which are made of insulators, are arranged two-dimensionally on the upper surface of the substrate such that the nanowires extend perpendicularly to the upper surface of the substrate. The electrode pad 50 is arranged at upper ends of the nanowires 81 so as to have a gap between the electrode pad and the substrate, and is supported by the nanowires 81. Therefore, parasitic capacitances generated by the substrate made of a semiconductor with high dielectric constant, which is present under the electrode pad 50, can be greatly reduced. Therefore, noise in the signal input to the transistor can be reduced.

Although the present invention has been described above based on the embodiments, the present invention is not limited to the embodiments described above, and various alterations are possible within the scope of the claims.

ADVANTAGE OF THE INVENTION

According to at least one embodiment of the present disclosure, a semiconductor device is configured to have reduced parasitic capacitance of an electrode pad connected to a gate electrode.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
   a substrate;
   a gate electrode, a source electrode, and a drain electrode, the gate electrode, the source electrode and the drain electrode being formed on the substrate;
   a plurality of nonconductive nanowires formed two-dimensionally on an upper surface of the substrate so as to extend perpendicularly to the upper surface of the substrate;
   an electrode pad formed at upper ends of the plurality of nonconductive nanowires so as to have a gap between the electrode pad and the substrate, the electrode pad being supported by the plurality of nonconductive nanowires; and
   an extraction electrode connecting the electrode pad and the gate electrode.

2. The semiconductor device as claimed in claim 1, further comprising:
   an active region formed on the upper surface of the substrate, wherein the gate electrode, the source electrode, and the drain electrode are formed on an upper surface of the active region, and the active region includes a channel layer and an electron supply layer.

3. The semiconductor device as claimed in claim 1, wherein the plurality of nonconductive nanowires are made of non-doped GaAs.

4. The semiconductor device as claimed in claim 1, wherein the substrate includes a first layer made of a same material as a material used for the plurality of nonconductive nanowires, and lower ends of the plurality of nonconductive nanowires are in contact with the first layer.

5. The semiconductor device as claimed in claim 1, wherein the plurality of nonconductive nanowires are made of semiconductors deactivated by introducing defects.

6. The semiconductor device as claimed in claim 1, further comprising:
   an insulating film disposed over the substrate, wherein the insulating film includes a gap at positions of the plurality of nanowires such that at least some of the plurality of nonconductive nanowires are not in contact with the insulating film.

7. The semiconductor device as claimed in claim 1, wherein the plurality of nonconductive nanowires are made of insulators.

8. An amplifier circuit comprising:
   a substrate;
   a gate electrode, a source electrode, and a drain electrode, the gate electrode, the source electrode, and the drain electrode being formed on the substrate;
   a plurality of nonconductive nanowires formed two-dimensionally on an upper surface of the substrate so as to extend perpendicularly to the upper surface of the substrate;
   an electrode pad formed at upper ends of the plurality of nonconductive nanowires so as to have a gap between the electrode pad and the substrate, the electrode pad being supported by the plurality of nonconductive nanowires;
   an extraction electrode connecting the electrode pad and the gate electrode; and
   a first matching circuit configured to apply an external input signal to the electrode pad; and a second matching circuit configured to output a signal from the source electrode or the drain electrode to an outside.

9. A method of manufacturing a semiconductor device, the method comprising:

forming a substrate including a first layer, the first layer being made of a first material;

forming a transistor on the substrate;

forming a plurality of nonconductive nanowires by crystal growth on an upper surface of the first layer, the plurality of nonconductive nanowires being made of the first material; and forming an electrode pad at upper ends of the plurality of nonconductive nanowires so as to have a gap between the electrode pad and the substrate, the electrode pad being supported by the plurality of nonconductive nanowires.

\* \* \* \* \*